United States Patent [19]

Nagaoka et al.

[11] Patent Number: 5,886,934
[45] Date of Patent: Mar. 23, 1999

[54] SEMICONDUCTOR MEMORY DEVICE CAPABLE OF THROUGH RATE CONTROL OF EXTERNAL OUTPUT SIGNAL WAVEFORM

[75] Inventors: Hideaki Nagaoka; Tomohisa Wada, both of Hyogo, Japan

[73] Assignee: Mitsubishi Denki Kabushiki Kaisha, Tokyo, Japan

[21] Appl. No.: 897,829

[22] Filed: Jul. 21, 1997

[30] Foreign Application Priority Data

Dec. 2, 1996 [JP] Japan .................................. 8-321728

[51] Int. Cl.⁶ ...................................................... G11C 7/00
[52] U.S. Cl. ................ 365/189.11; 365/191; 365/189.01
[58] Field of Search ........................ 365/189.05, 189.01, 365/189.09, 105, 191, 198

[56] References Cited

U.S. PATENT DOCUMENTS

| | | | |
|---|---|---|---|
| 4,890,016 | 12/1989 | Tanaka et al. | |
| 5,140,194 | 8/1992 | Okitaka . | |
| 5,371,705 | 12/1994 | Nakayama | 365/189.09 |
| 5,473,565 | 12/1995 | Kusakari | 365/189.01 |
| 5,500,820 | 3/1996 | Nakaoka | 365/189.01 |

FOREIGN PATENT DOCUMENTS 1-188023  7/1989  Japan .
5-225782  9/1993  Japan .

OTHER PUBLICATIONS

"A 34-ns 1-Mbit CMOS SRAM Using Triple Polysilicon", T. Wada et al., IEEE Journal of Solid-State Circuits, vol. sc-22, No. 5, Oct. 1987 pp. 727-732.

*Primary Examiner*—David Nelms
*Assistant Examiner*—Thong Le
*Attorney, Agent, or Firm*—McDermott, Will & Emery

[57] ABSTRACT

A semiconductor memory device comprises first and second data buses. An output drive circuit adjusts the potentials at the first and second data buses in response to an internal read signal read from a memory cell. The gates of a PMOS transistor and an NMOS transistor forming an output stage corresponding to an output final stage are connected to ends of the first and second data buses, respectively. The potential of an output signal derived from the output stage loosely transits with a value decided by the capacitances of the first and second data buses. Thus, through rate control of the output signal can be implemented without reducing current drivability of the MOS transistors forming the output final stage.

16 Claims, 27 Drawing Sheets

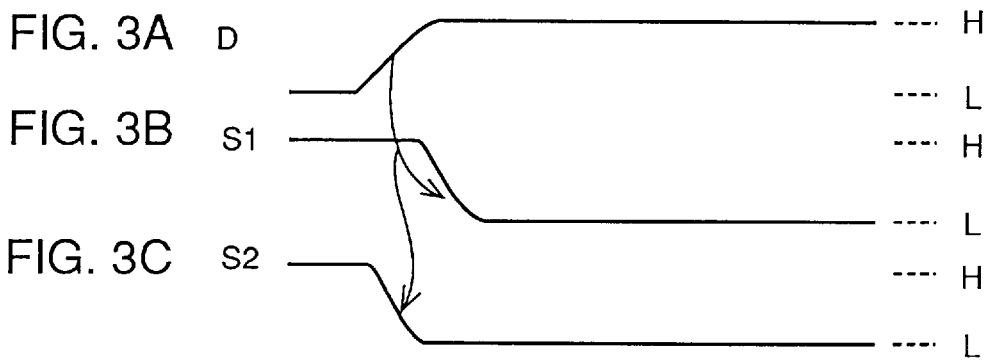
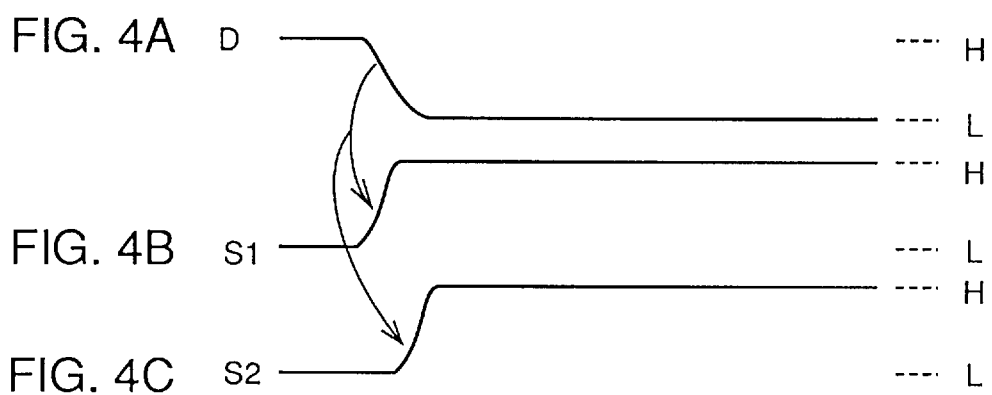

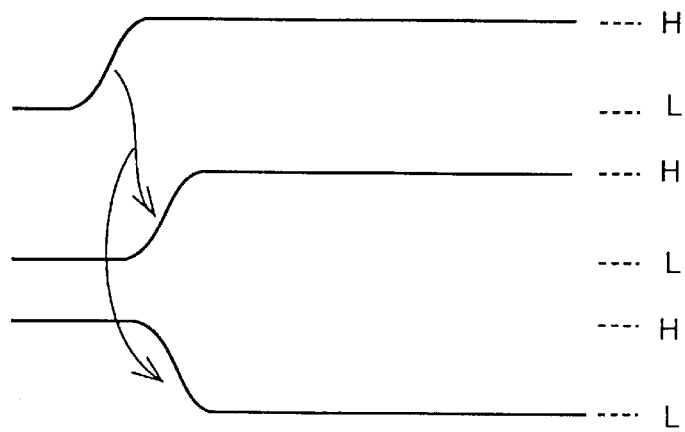
FIG. 10A  D
FIG. 10B  OUTPUT OF NA12, NR4
FIG. 10C  S1
FIG. 11A  D
FIG. 11B  OUTPUT OF NA12, NR4
FIG. 11C  S1

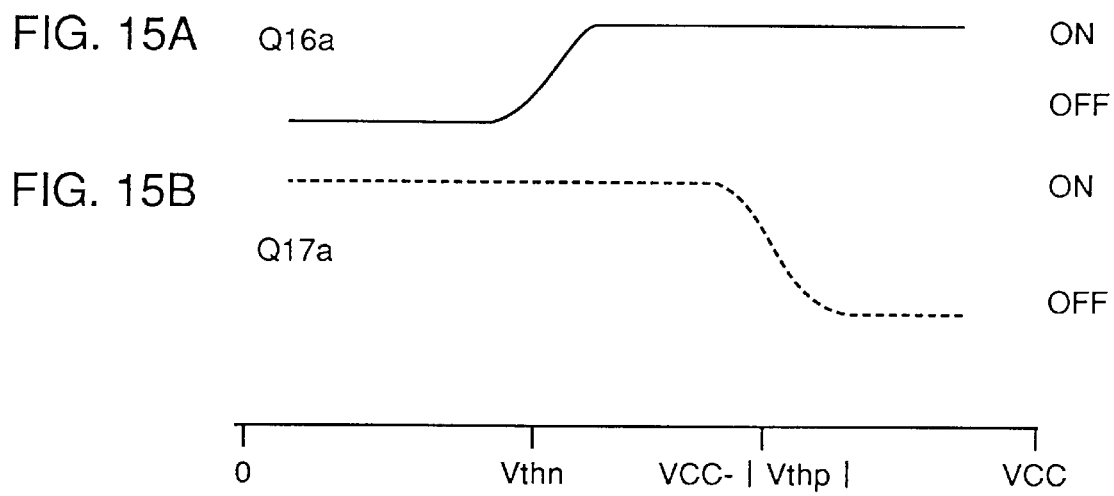
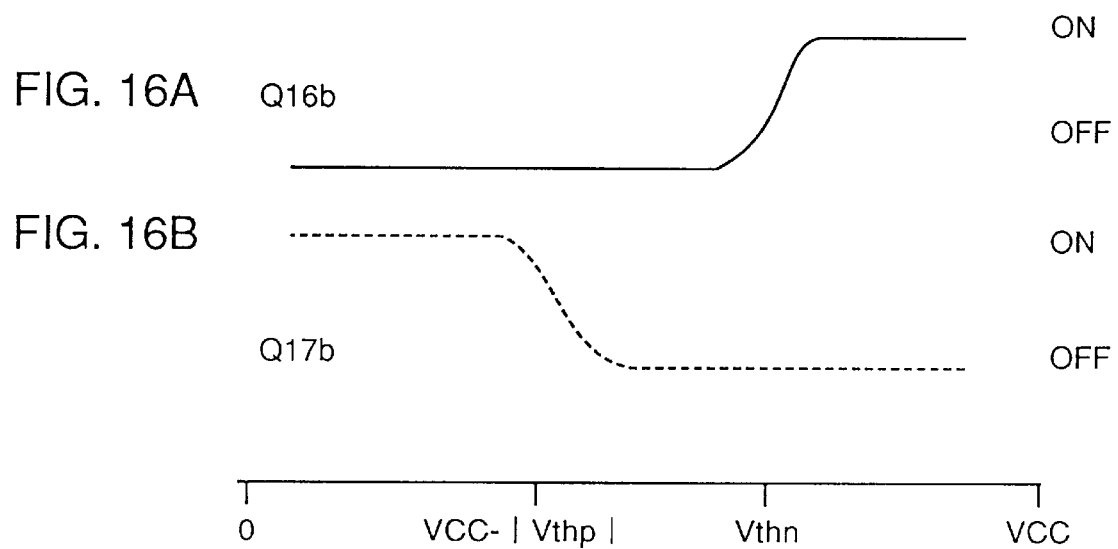

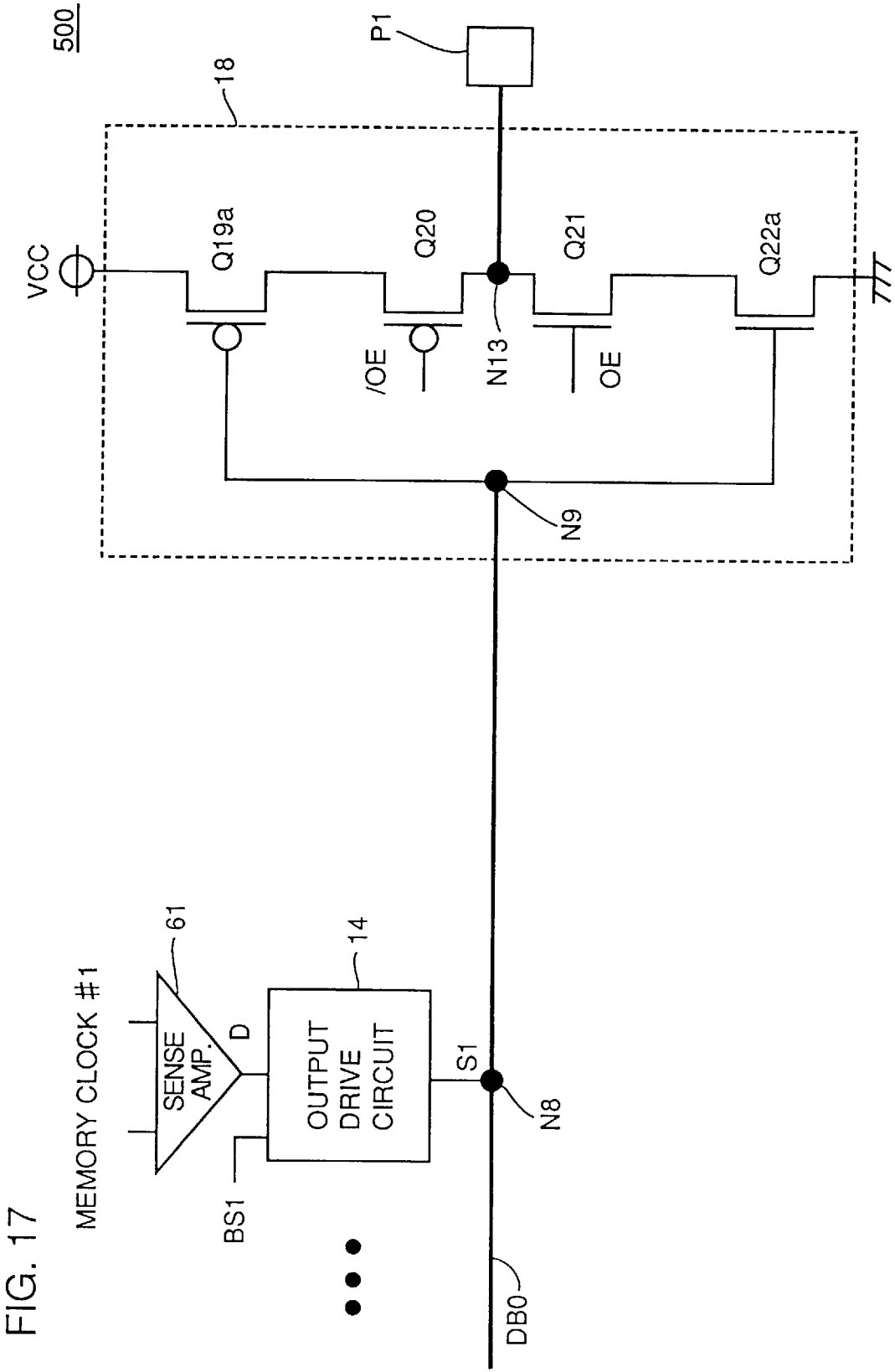

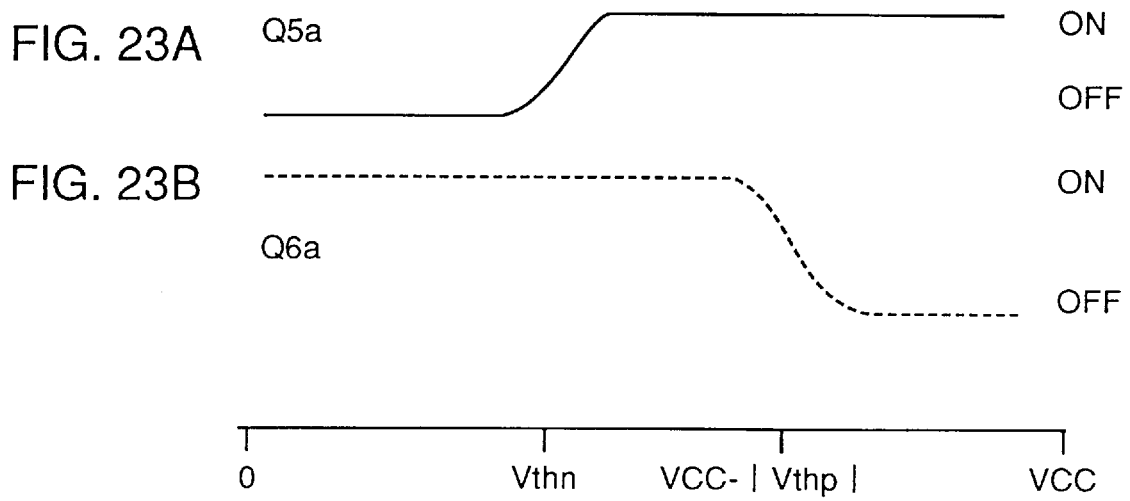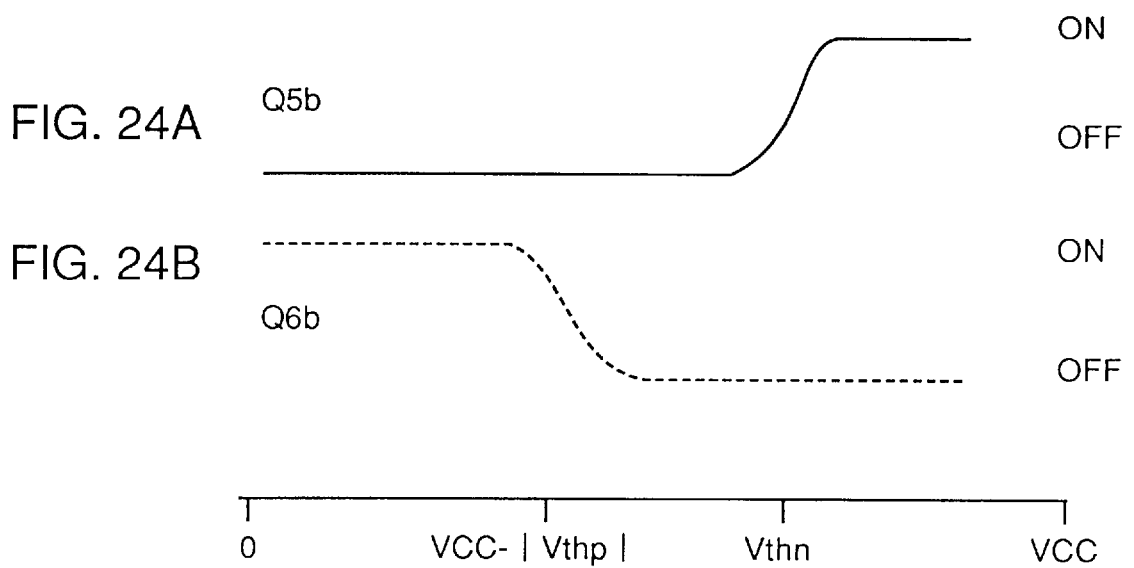

FIG. 30A PRIOR ART D
FIG. 30B PRIOR ART C1
FIG. 30C PRIOR ART C2
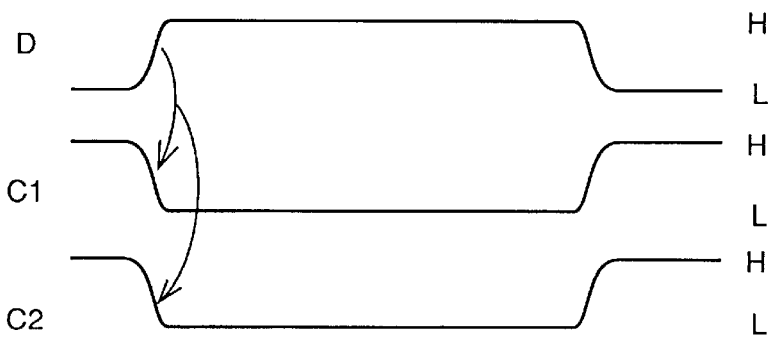
FIG. 30D PRIOR ART VOUT
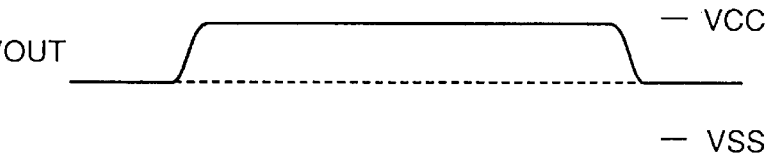
FIG. 31A PRIOR ART D
FIG. 31B PRIOR ART C1
FIG. 31C PRIOR ART C2
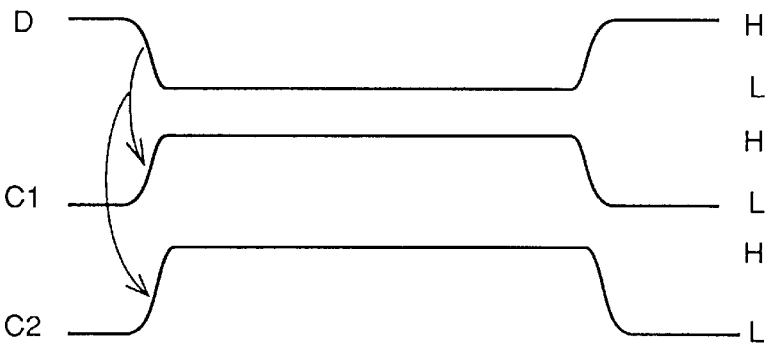
FIG. 31D PRIOR ART VOUT
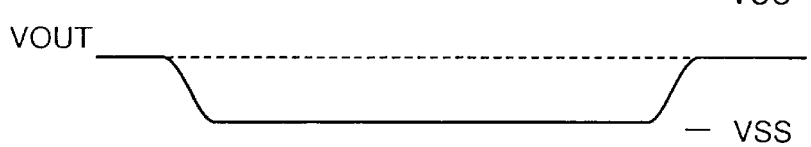

5,886,934

SEMICONDUCTOR MEMORY DEVICE CAPABLE OF THROUGH RATE CONTROL OF EXTERNAL OUTPUT SIGNAL WAVEFORM

BACKGROUND OF THE INVENTION

1. Field of the Invention

The present invention relates to a semiconductor memory device, and more particularly, it relates to a semiconductor memory device which can inhibit an overshoot and an undershoot of an output signal waveform.

2. Description of the Background Art

In general, a semiconductor memory device comprises an output buffer circuit which receives a signal of a memory cell amplified by a sense amplifier and generates an external output signal. The external output signal generated in the output buffer circuit is outputted to the exterior of the semiconductor memory device through an output pad, for driving a load which is connected externally such as an external transmission line or another semiconductor memory device connected to the end of an external transmission line, for example.

FIG. 25 is a block diagram schematically showing the structure of a principal part of a static random access memory (hereinafter referred to as an SRAM) 900, which is an exemplary conventional semiconductor memory device. The conventional SRAM 900 comprises an address buffer circuit 52, a row decoder 53, a column decoder 54, memory blocks #1 to #4, a block selection circuit 55, a write driver group 59, and a sense amplifier group 60.

The address buffer circuit 52 receives signals from external address pins XA1 to XA8, YA1 to YA8 and ZA1 and ZA2, and generates internal row address signals X1 to X8, internal column address signals Y1 to Y8 and block address signals Z1 to Z4 respectively. The row decoder 53 receives the internal row address signals X1 to X8 and decodes the same, for raising the potential of a word line selected from a plurality of word lines WL forming a memory cell array 56 described later. The column decoder 54 receives the internal column address signals Y1 to Y8 and decodes the same, for selecting any of a plurality of pairs of bit lines BL and /BL forming the memory cell array 56 described later. The block selection circuit 55 receives the internal block address signals Z1 to Z4 and decodes the same, for generating block selection signals BS1 to BS4. The block selection signals BS1 to BS4 select a sense amplifier 61 described later which is connected with a data bus DB0 among a plurality of sense amplifiers 61 included in the sense amplifier group 60.

FIG. 26 is a circuit diagram for illustrating the structure of each memory block provided in the conventional SRAM 900. This figure representatively shows a structure in relation to the memory block #1.

The memory block #1 comprises the memory cell array 56. The memory cell array 56 includes a plurality of memory cells MC which are arranged in the form of a matrix in row and column directions, a plurality of word lines WL each connected with a row of memory cells MC, and a plurality of pairs of bit lines BL and /BL each connected with a column of memory cells MC.

FIG. 27 is a circuit diagram schematically showing an exemplary structure of each memory cell MC employed in the conventional SRAM 900. The high-resistance load memory cell MC shown in FIG. 27 includes resistors R1 and R2, N-channel field-effect transistors (hereinafter referred to as NMOS transistors) Q53 and Q54 which are drive transistors, and NMOS transistors Q51 and Q52 which are access transistors.

The resistor R1 and the NMOS transistor Q53 as well as the resistor R2 and the NMOS transistor Q54 are serially connected between internal power supply potentials VCC and ground potentials VSS respectively. The gate of the NMOS transistor Q53 is connected to a node N51 corresponding to a connection point between the resistor R2 and the NMOS transistor Q54, while that of the NMOS transistor Q54 is connected to a node N50 corresponding to a connection point between the resistor R1 and the NMOS transistor Q53.

The NMOS transistor Q51 has a first conducting terminal which is connected with the bit line BL, a second conducting terminal which is connected with the node N50, and a gate which is connected with the word line WL. The NMOS transistor Q52 has a first conducting terminal which is connected with the bit line /BL, a second conducting terminal which is connected with the node N51, and a gate which is connected with the word line WL.

Referring again to FIG. 26, the memory block #1 further comprises a bit line load circuit 57 and data multiplexers 58. The bit line load circuit 57 is adapted to apply a proper voltage bias to the memory cells MC. The data multiplexers 58 are circuits employed for inputting/outputting signals from/to the memory cell array 56. The data multiplexers 58 receive the internal column address signals Y1 and Y2 outputted from the column decoder 54, for connecting a selected pair of bit lines BL and /BL with the sense amplifier 61 described later. A write driver 63 shown in FIG. 26, which is a circuit included in the write driver group 59 shown in FIG. 25, receives a signal on the data bus DB0 and writes the same in the corresponding memory block #1.

The sense amplifier 61 shown in FIG. 26, which is a circuit included in the sense amplifier group 60 shown in FIG. 25, amplifies slight potential changes of the selected pair of bit lines BL and /BL. Each sense amplifier 61 receives a corresponding one of the block selection signals BS1 to BS4 outputted from the block selection circuit 55. A single sense amplifier 61 is selected on the basis of each block selection signal. The selected sense amplifier 61 outputs an internal read signal D on the data bus DB0 described later.

Referring again to FIG. 25, the conventional SRAM 900 further includes the data bus DB0, an input buffer circuit 62, and an output buffer circuit 50. The data bus DB0 is a transmission line connecting the sense amplifier group 60 with the output buffer circuit 50. The input buffer circuit 62 converts external input data received from an input/output terminal DQ to an internal write signal in a write operation. The output buffer circuit 50 receives the internal read signal D transmitted from the data bus DB0 in a read operation, and generates an external output signal. This external output signal is outputted from the input/output terminal DQ to the exterior, for driving an external load.

FIG. 28 is a block diagram schematically showing a structure in relation to the output buffer circuit 50 in the conventional SRAM 900. This figure representatively shows connection between the sense amplifier 61 corresponding to the memory block #1 and the output buffer circuit 50.

An output node of the sense amplifier 61 is connected to the data bus DB0. An end of the data bus DB0 is connected to an input node of the output buffer circuit 50. An output node of the output buffer circuit 50 is connected to an output pad P1. A P-channel field-effect transistor (hereinafter referred to as a PMOS transistor) Q23 has a first conducting terminal which is connected with the internal power supply potential VCC, a second conducting terminal which is connected onto the data bus DB0, and a gate receiving an internal write enable signal /WE.

When the internal write enable signal /WE is at a low level, the PMOS transistor Q23 enters a conducting state, and the potential of the data bus DB0 goes high. When the internal write enable signal /WE is at a high level, on the other hand, the PMOS transistor Q23 enters a non-conducting state. In case of a non-write operation (the internal write enable signal /WE is at a high level), therefore, the internal read signal D outputted from the sense amplifier 61 selected on the basis of the block selection signal BS1 is transmitted to the output buffer circuit 50 through the data bus DB0. In case of a write operation (the internal write enable signal /WE is at a low level), on the other hand, the potential on the data bus DB0 goes high, for preventing the data bus DB0 from entering a floating state.

FIG. 29 is a circuit diagram schematically showing the structure of the output buffer circuit 50 included in the conventional SRAM 900. The output buffer circuit 50 shown in FIG. 29, which is a tri-state output buffer circuit, outputs a signal of a high level, a low level, or a high impedance (non-read state) value. The output buffer 50 receives the internal read signal D outputted from the sense amplifier 61 at its input through the data bus DB0.

Referring to FIG. 29, the output buffer circuit 50 comprises a pre-buffer circuit 70, and an output stage 1 corresponding to an output final stage. The pre-buffer circuit 70 includes a NAND circuit NA1, a NOT circuit NT1, and a NOR circuit NR1. The NAND circuit NA1 receives an output enable signal OE and the internal read signal D. The NOT circuit NT1 receives the output enable signal OE and outputs an internal output enable signal /OE obtained by inverting the same. The NOR circuit NR1 receives the internal output enable signal /OE outputted from the NOT circuit NT1 and the internal read signal D. The output enable signal OE is in an activated state (high level) in a read operation, and in an inactivated state (low level) in a non-read operation.

The output stage 1 comprises a PMOS transistor Q5a and an NMOS transistor Q6a which are complementarily connected between the internal power supply potential VCC and the ground potential VSS. The gates of the PMOS transistor Q5a and the NMOS transistor Q6a receive signals C1 and C2 outputted from the NAND circuit NA1 and the NOR circuit NR1 respectively. A node N0, which is a connection point between first conducting terminals of the PMOS transistor Q5a and the NMOS transistor Q6a, is connected to the output pad P1.

Operations of the conventional output buffer circuit 50 are now described. With reference to FIG. 30A, an operation of the output buffer circuit 50 receiving the internal read signal D of a high level at its input in a read operation (the output enable signal OE is at a high level) is now described.

Referring to FIG. 30B, the NAND circuit NA1 receives the output enable signal OE of a high level and the internal read signal D of a high level, and outputs the signal C1 of a low level. Referring to FIG. 30C, on the other hand, the NOR circuit NR1 receives the internal output enable signal /OE of a low level outputted from the NOT circuit NT1 and the internal read signal D of a high level, and outputs the signal C2 of a low level.

Receiving the signals C1 and C2 of a low level, the PMOS transistor Q5a and the NMOS transistor Q6a enter a conducting state and a non-conducting state respectively. In this case, the node N0 is charged to the level of the internal power supply potential VCC. Referring to FIG. 30D, the output pad P1 consequently outputs an external output signal VOUT of a high level.

With reference to FIG. 31A, an operation of the output buffer circuit 50 receiving the internal read signal D of a low level at its input in a read operation is described.

Referring to FIG. 31B, the NAND circuit NA1 receives the output enable signal OE of a high level and the internal read signal D of a low level, and outputs the signal C1 of a high level. Referring to FIG. 31C, on the other hand, the NOR circuit NR1 receives the internal output enable signal /OE of a low level outputted from the NOT circuit NT1 and the internal read signal D of a low level, and outputs the signal C2 of a high level.

Receiving the signals C1 and C2 of a high level, the PMOS transistor Q5a and the NMOS transistor Q6a enter a non-conducting state and a conducting state respectively. In this case, the node N0 is discharged to the level of the ground potential VSS. Consequently, the output pad P1 outputs the external output signal VOUT of a low level.

In a non-read operation (the output enable signal OE is at a low level), the NAND circuit NA1 receives the output enable signal OE of a low level, and outputs the signal C1 of a high level. On the other hand, the NOR circuit NR1 receives the internal output enable signal /OE of a high level outputted from the NOT circuit NT1, and outputs the signal C2 of a low level.

Receiving the signals C1 and C2 of high and low levels, both the PMOS transistor Q5a and the NMOS transistor Q6a enter non-conducting states. Consequently, the node N0, i.e., the output pad P1 enters a high impedance state.

FIG. 32 is a circuit diagram showing the structure of another conventional output buffer 51, which can be employed in place of the output buffer circuit 50 shown in FIG. 29. The output buffer circuit 51 shown in FIG. 32 comprises a pre-buffer circuit 71 comprising NAND circuits NA2 and NA3 and NOT circuits NT2 to NT4, and an output stage 1.

The output buffer circuit 50 provided in the conventional semiconductor memory device has the following problems:

First, the sense amplifier group 60 transmits signals to the output buffer circuit 50 through the data bus DB0. Therefore, the sense amplifier group 60 must drive a high capacitance toward the output buffer circuit 50. Thus, signal transmission takes much time, leading to a long time for transition of the external output signal VOUT.

Further, MOS transistors forming the pre-buffer circuit 70 drive only the capacitances of the PMOS transistor Q5a and the NMOS transistor Q6a forming the output stage 1. Therefore, the signals C1 and C2 outputted from the pre-buffer circuit 70 have steep waveforms. Thus, there is the possibility that an overshoot and an understood result in the external output signal VOUT outputted from the output stage 1 at an external transmission end portion.

FIGS. 33A, 33B and 33C show changes of the signals C1 and C2, a change of the external output signal VOUT, and states of an overshoot and an undershoot at the external transmission line end portion respectively for illustrating the problem of the conventional semiconductor memory device. Distortion of the signal waveform such as the overshoot or the undershoot serves as a noise source for a peripheral circuit connected externally, to cause loss in an access time or a malfunction on a receiver externally connected, for example. In order to solve this problem, the gate widths W of the MOS transistors forming the output stage 1 corresponding to the output final stage may be reduced for suppressing current drivability. However, this method is limited due to reduction of charge/discharge currents from the output stage 1.

In general, therefore, the gate widths W of the MOS transistors forming the pre-buffer circuit 70 is reduced for retarding rise and fall times of the signal waveforms inputted to the output stage 1. According to this method, it is possible to retard the rise and fall times of the waveform of the external output signal VOUT (through rate control) by retarding the switching rate at the output stage 1.

In this method, however, the waveform of each signal outputted from the sense amplifier group 60 is temporarily dulled by the capacitance of the data bus DB0, then steepened in the pre-buffer circuit 70, and further dulled in the output stage 1 again. This disadvantageously leads to loss of the access time.

SUMMARY OF THE INVENTION

Accordingly, an object of the present invention is to provide a semiconductor memory device which can output a stable signal by retarding rise and fall times of the waveform of the outputted signal without damaging the access time.

The semiconductor memory device according to the present invention generates an output signal in response to an internal signal read from a selected memory cell and outputs the same to an external load from an output terminal in a read operation mode. The semiconductor memory device further comprises a transmisison line, a drive circuit for adjusting the potential of the transmission line in response to the internal signal, and an output signal generator circuit generating the output signal in response to the potential at an end portion of the transmission line with operating power sources formed by a first power source supplying a first potential and a second power source supplying a second potential which is lower than the first potential.

A principal advantage of the present invention resides in that through rate control is enabled by utilizing the capacitance of the transmission line without changing the gate widths of a MOS transistors forming the output signal generator circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3C are signal waveform diagrams showing operations of the output drive circuit according to the first embodiment;

FIGS. 4A to 4C are signal waveform diagrams showing operations of the output drive circuit according to the first embodiment;

FIGS. 10A to 10C are signal waveform diagrams showing operations of the output drive circuit according to the third embodiment;

FIGS. 11A to 11C are signal waveform diagrams showing operations of the output drive circuit according to the third embodiment;

FIGS. 15A and 15B are signal waveform diagrams showing conducting and non-conducting states of MOS transistors respectively for illustrating an effect of the fourth embodiment;

FIGS. 16A and 16B are signal waveform diagrams showing conducting and non-conducting states of the MOS transistors respectively for illustrating another effect of the fourth embodiment;

FIG. 17 is a block diagram schematically showing the structure of a principal part of a semiconductor memory device according to a fifth embodiment of the present invention;

FIGS. 23A and 23B are signal waveform diagrams showing conducting and non-conducting states of MOS transistors respectively for illustrating an effect of the eighth embodiment;

FIGS. 24A and 24B are signal waveform diagrams showing conducting and non-conducting states of the MOS transistors respectively for illustrating another effect of the eighth embodiment;

FIGS. 30A to 30D are signal waveform diagrams showing operations of the output buffer circuit in the conventional semiconductor memory device;

FIGS. 31A to 31D are signal waveform diagrams showing operations of the output buffer circuit in the conventional semiconductor memory device;

DESCRIPTION OF THE PREFERRED EMBODIMENTS

First Embodiment

Figure 1:
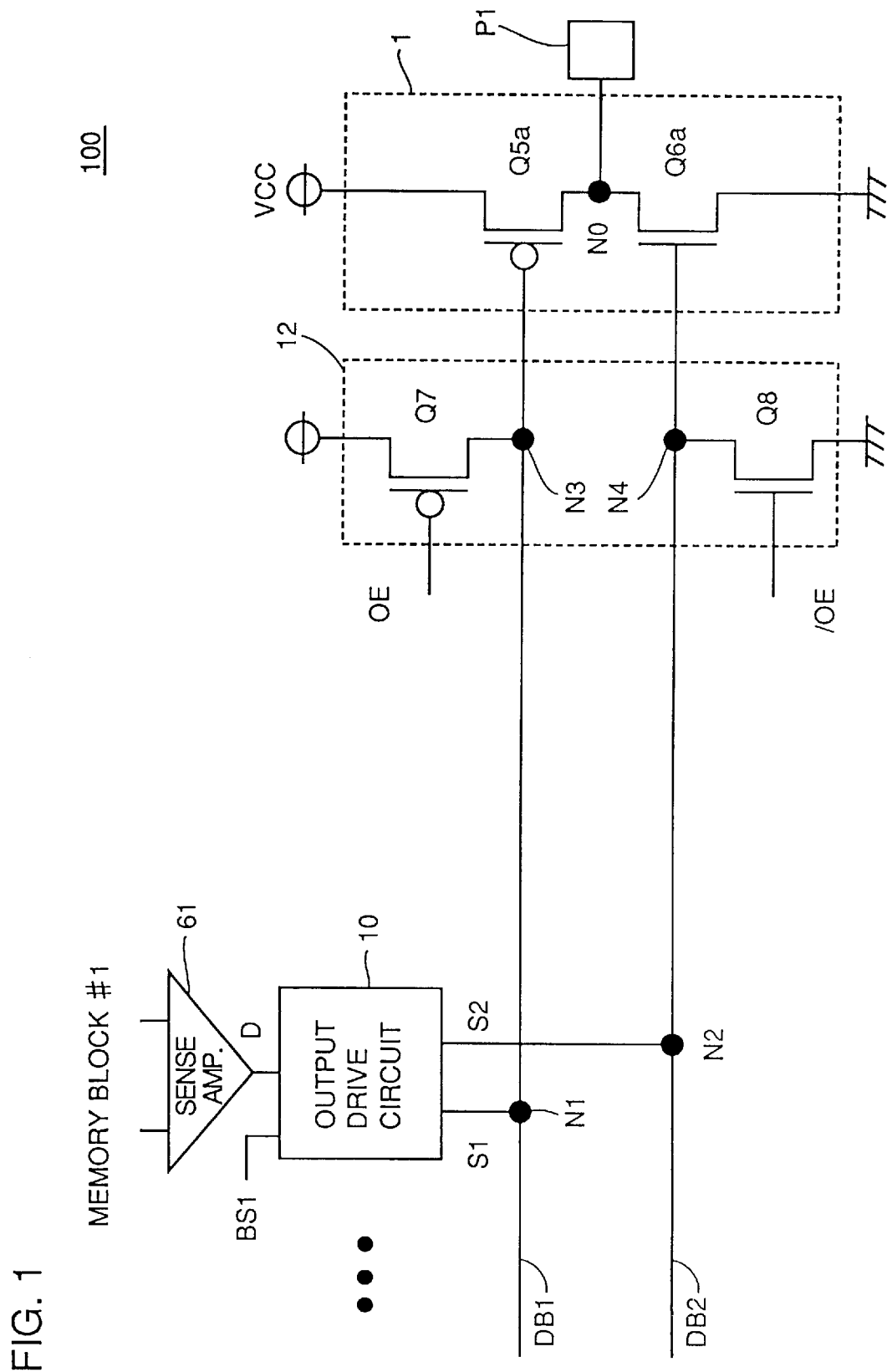
FIG. 1 is a block diagram schematically showing the structure of a principal part of a semiconductor memory device according to a first embodiment of the present invention.
Figure 28:
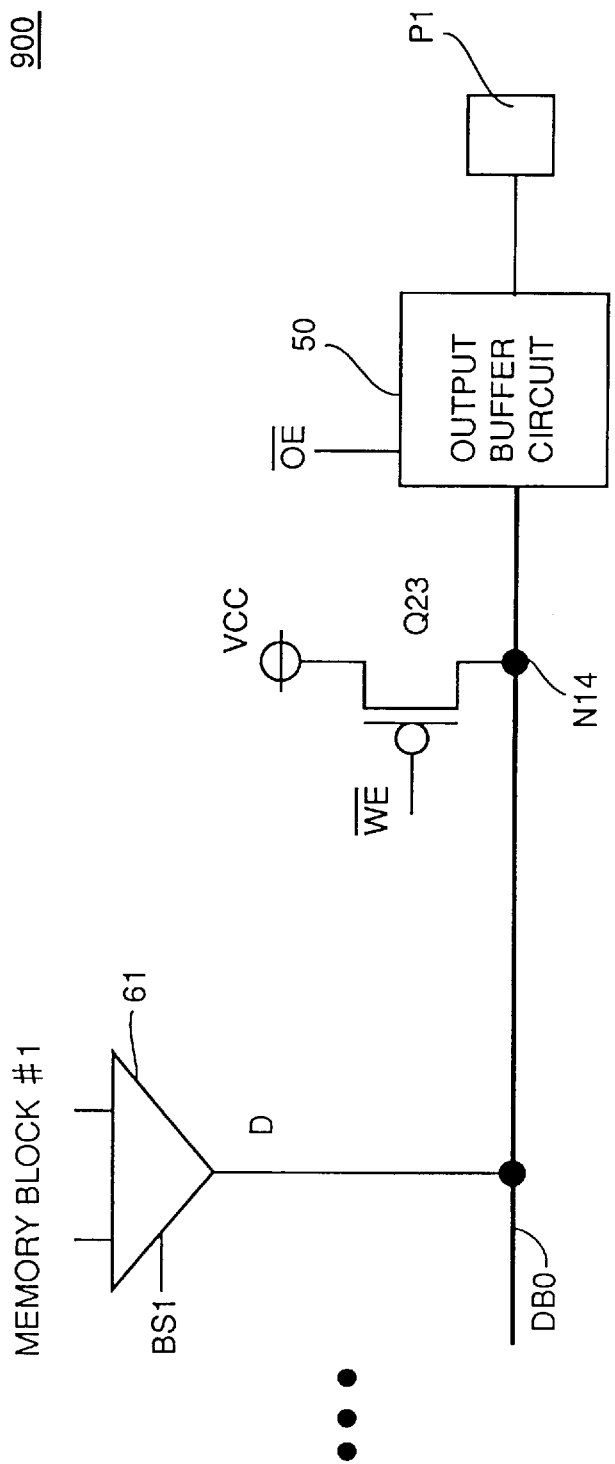
FIG. 28 is a block diagram schematically showing the structure of a principal part of the conventional semiconductor memory device.
Figure 29:
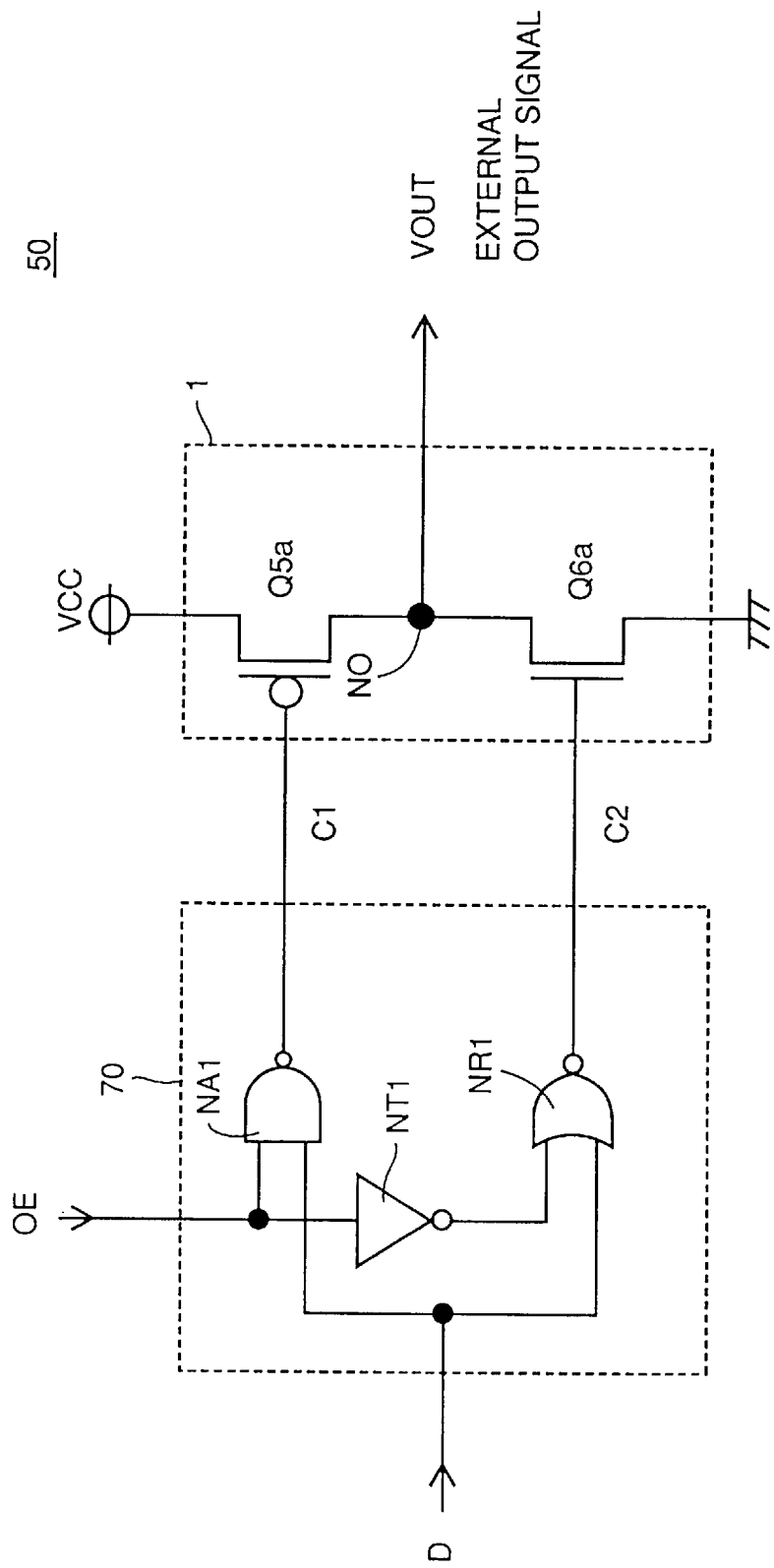
FIG. 29 is a circuit diagram schematically showing the structure of an output buffer circuit in the conventional semiconductor memory device.
Figure 32:
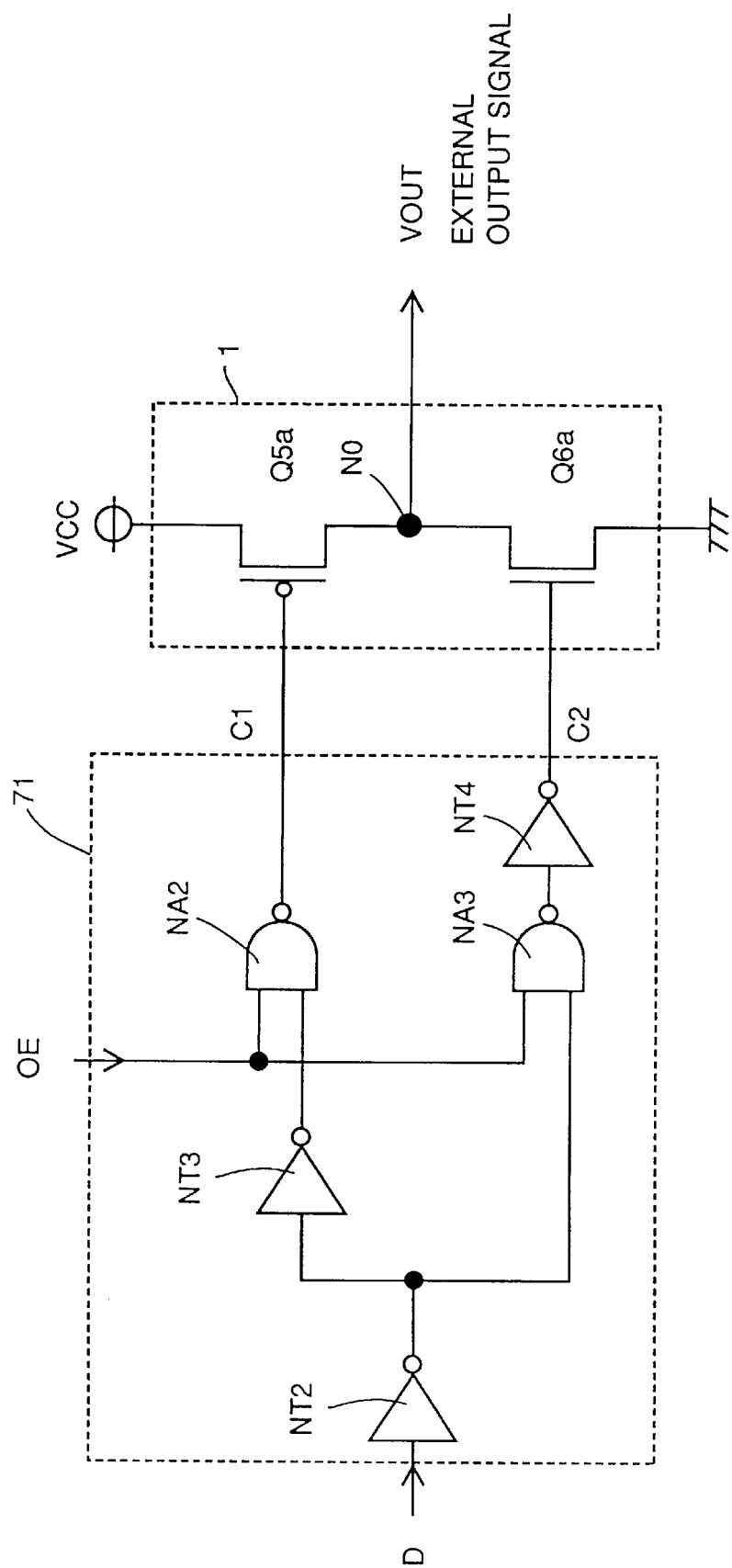
FIG. 32 is a circuit diagram schematically showing the structure of another output buffer circuit of the conventional semiconductor memory device.
Figure 33A:
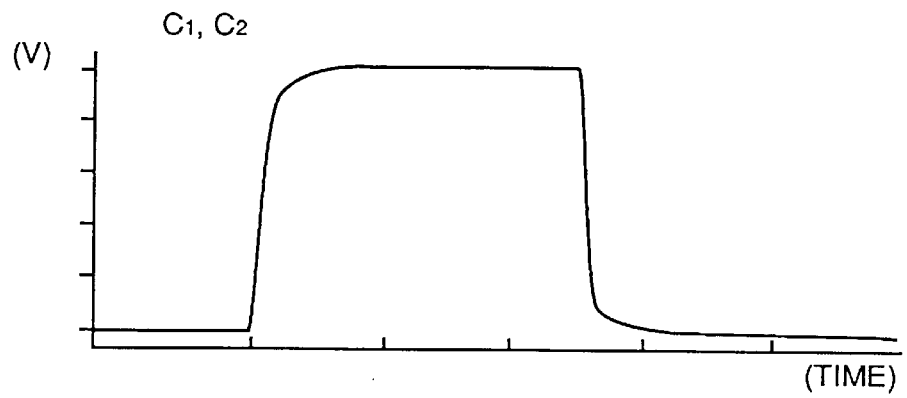
FIGS. 33A to 33C are signal waveform diagrams for illustrating a problem in the conventional semiconductor memory device.
Figure 33B:
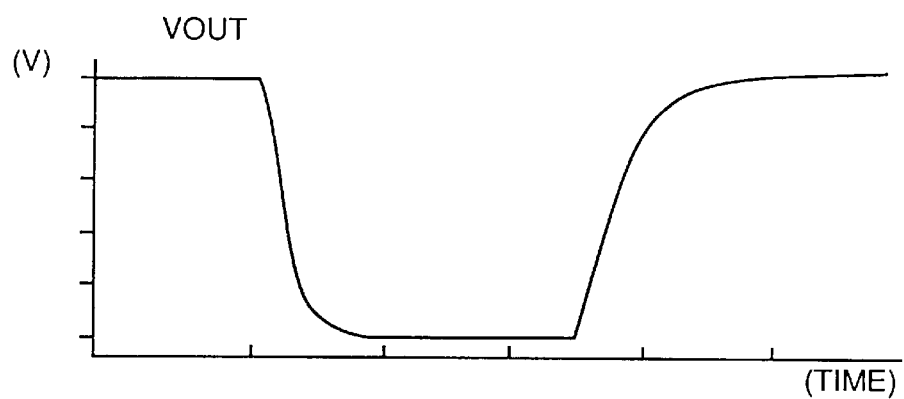
Figure 33C:
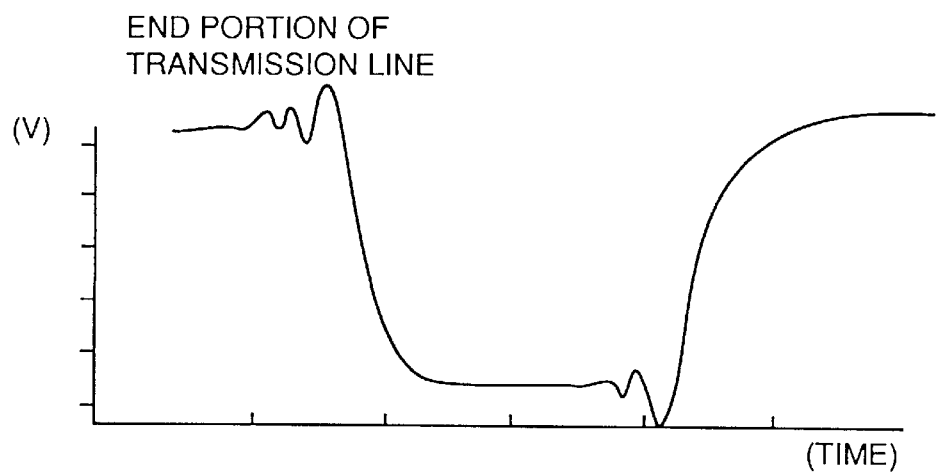

With reference to FIG. 1, the system structure of a principal part of a semiconductor memory device 100 according to a first embodiment of the present invention is now described. Elements identical to those of the conventional semiconductor memory device 900 shown in FIG. 28 are denoted by the same reference numerals and symbols, to omit redundant description.

The semiconductor memory device 100 according to the first embodiment is different from the conventional semiconductor memory device 900 in the following points: The semiconductor memory device 100 shown in FIG. 1 comprises two data buses DB1 and DB2, in place of the data bus DB0 shown in FIG. 28. The semiconductor memory device 100 shown in FIG. 1 further comprises an output drive circuit 10 and an output stage 1, in place of the output buffer circuit 50 shown in FIG. 28. In the embodiment shown in FIG. 1, the output drive circuit 10 and the output stage 1 are connected with each other through the data buses DB1 and DB2. The semiconductor memory device 100 shown in FIG. 1 further comprises a control circuit 12 for forcibly setting potentials at the data buses DB1 and DB2 at certain values.

FIG. 1 representatively shows connection between a sense amplifier 61 corresponding to a memory block #1 and the output drive circuit 10 and the output stage 1. The output drive circuit 10 is connected with each sense amplifier 61 corresponding to each of memory blocks #1 to #4. The output drive circuit 10 corresponding to the memory block #1 has a first input node which is connected with an output node of the sense amplifier 61, and a second input node receiving a block selection signal BS1 outputted from a block selection circuit 55. The output drive circuit 10 has output nodes which are connected with nodes N1 and N2 on the data buses DB1 and DB2 respectively.

A PMOS transistor Q5a forming the output stage 1 has a gate which is connected to the data bus DB1, and an NMOS transistor Q6a also forming the output stage 1 has a gate which is connected to the data bus DB2. A node N0 corresponding to a connection point between the PMOS transistor Q5a and the NMOS transistor Q6a is connected to an output pad P1.

Figure 2:
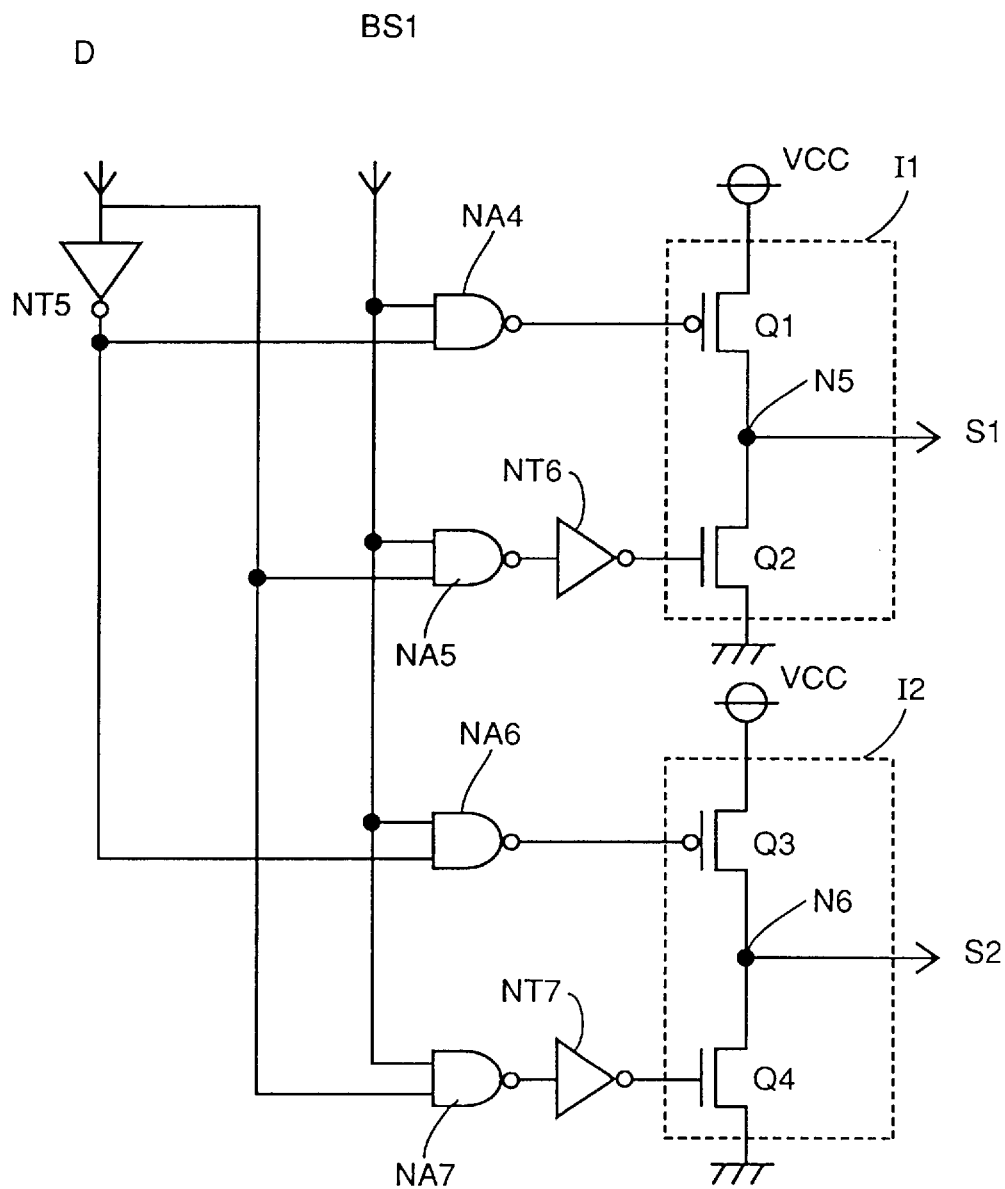
FIG. 2 is a circuit diagram schematically showing the structure of an output drive circuit according to the first embodiment.

FIG. 2 representatively shows the structure of the output drive circuit 10 which is connected to the sense amplifier 61 corresponding to the memory block #1. Referring to FIG. 2, the output drive circuit 10 receives the block selection signal BS1 and an internal read signal D outputted from the sense amplifier 61, and forms first and second internal signals S1 and S2. The output drive circuit 10 includes NAND circuits NA4 to NA7, NOT circuits NT5 and NT6, and output stages I1 and I2. The NOT circuit NT5 inverts the internal read signal D and outputs a signal /D.

The NAND circuit NA4 receives the block selection signal BS1 and the signal /D outputted from the NOT circuit NT5. The NAND circuit NA5 receives the block selection signal BS1 and the internal read signal D. The NOT circuit NT6 inverts a signal outputted from the NAND circuit NA5. The NAND circuit NA6 receives the block selection signal BS1 and the signal /D outputted from the NOT circuit NT5. The logical level of a signal outputted from the NAND circuit NA6 coincides with that of a signal outputted from the NAND circuit NA4. The NAND circuit NA7 receives the block selection signal BS1 and the internal read signal D. The NOT circuit NT7 inverts a signal outputted from the NAND circuit NA7. The logical level of the signal outputted from the NAND circuit NA7 coincides with that of the signal outputted from the NAND circuit NA5.

The output stage I1 comprises a PMOS transistor Q1 and an NMOS transistor Q2 which are complementarily connected between an internal power supply potential VCC and a ground potential VSS, and the output stage I2 comprises a PMOS transistor Q3 and an NMOS transistor Q4 which are complementarily connected between the internal power supply potential VCC and the ground potential VSS. The logical threshold values of the PMOS transistor Q1 and the NMOS transistor Q2 forming the output stage I1 are higher than those of the PMOS transistor Q3 and the NMOS transistor Q4 forming the output stage I2.

In the output stage I1, the gates of the PMOS transistor Q1 and the NMOS transistor Q2 receive the signals outputted from the NAND circuit NA4 and the NOT circuit NT6 respectively. The output stage I1 outputs the first internal signal S1 from a node N5 which is a connection point between the PMOS transistor Q1 and the NMOS transistor Q2 to the node N1 corresponding to a connection point between the output stage I1 and the data bus DB1.

In the output stage I2, the gates of the PMOS transistor Q3 and the NMOS transistor Q4 receive the signals outputted from the NAND circuit NA6 and the NOT circuit NT7 respectively. The output stage I2 outputs the second internal signal S2 from a node N6 which is a connection point between the PMOS transistor Q3 and the NMOS transistor Q4 to the node N2 corresponding to a connection point between the output stage I2 and the data bus DB2.

Operations of the output drive circuit 10 are now described. With reference to FIGS. 3A to 3C, an operation in case of receiving the internal read signal D of a high level in a read operation (an output enable signal OE is at a high level) is now described (it is assumed that the block selection signal BS1 is at a high level). The NAND circuits NA4 and NA6 receive the block selection signal BS1 of a high level and the signal /D of a low level and output signals of high levels, respectively. The NAND circuits NA5 and NA7 receive the block selection signal BS1 of a high level and the internal read signal D of a high level and output signals of low levels, respectively. The NOT circuits NT6 and NT7 receive the signals of low levels from the NAND circuits NA5 and NA7 and output signals of high levels, respectively.

In response to this, the PMOS transistor Q1 and the NMOS transistor Q2 enter non-conducting and conducting states respectively. Therefore, the node N5 is discharged to the level of the ground potential VSS. Consequently, the potential of the first internal signal S1 goes low. Further, the PMOS transistor Q3 and the NMOS transistor Q4 enter non-conducting and conducting states respectively. Therefore, the node N6 is discharged to the level of the ground potential VSS. Consequently, the potential of the second internal signal S2 goes low.

With reference to FIGS. 4A to 4C, an operation in case of receiving the internal read signal D of a low level in a read operation is now described.

Referring to FIGS. 4A to 4C, the NAND circuits NA4 and NA6 receive the block selection signal BS1 of a high level and the signal /D of a high level and output signals of low levels, respectively. The NAND circuits NA5 and NA7 receive the block selection signal BS1 of a high level and the internal read signal D of a low level and output signals of high levels, respectively. The NOT circuits NT6 and NT7 receive the signals of high levels from the NAND circuits NA5 and NA7 and output signals of low levels, respectively. In response to this, the PMOS transistor Q1 and the NMOS transistor Q2 enter conducting and non-conducting states respectively. Therefore, the node N5 is charged to the level of the internal power supply potential VCC. Consequently, the potential of the first internal signal S1 goes high. Further, the PMOS transistor Q3 and the NMOS transistor Q4 enter conducting and non-conducting states respectively. Therefore, the node N6 is charged to the level of the internal power supply potential VCC. Consequently, the potential of the second internal signal S2 goes high.

The logical threshold values of the MOS transistors Q1 and Q2 forming the output stage I1 are higher than those of the MOS transistors Q3 and Q4 forming the output stage I2 as hereinabove described, and hence the transition speeds of the signals outputted from the output stages I1 and I2 are different from each other.

Therefore, the first internal signal S1 shifts from a high level to a low level after the second internal signal S2 shifts from a high level to a low level, as shown in FIGS. 3B and 3C. Further, the second internal signal S2 shifts from a low level to a high level after the first internal signal S1 shifts from a low level to a high level, as shown in FIGS. 4B and 4C.

Figure 5:
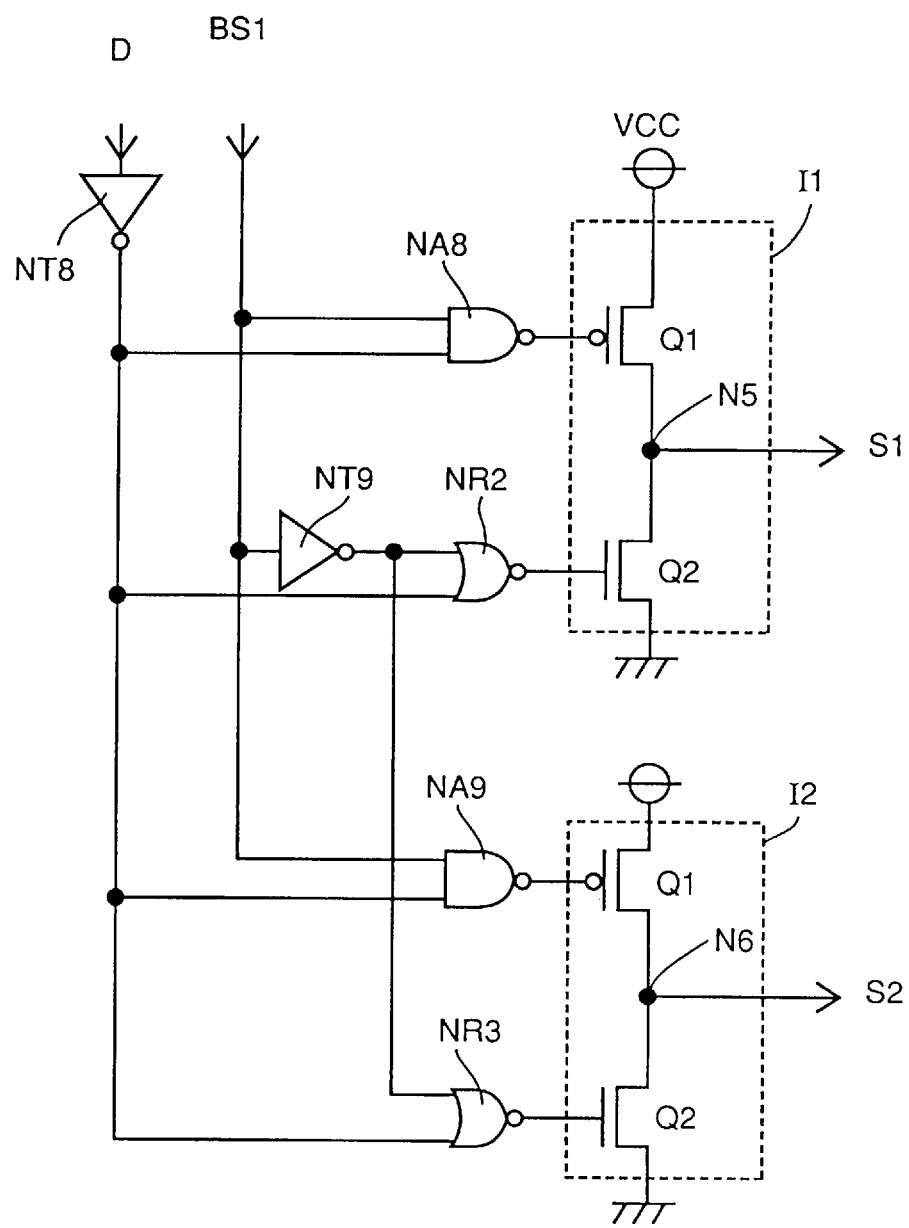
FIG. 5 is a circuit diagram showing the structure of another output drive circuit according to the first embodiment.

FIG. 5 shows the structure of another output drive circuit 11, which can substitute for the output drive circuit 10 for attaining the same effect. The output drive circuit 11 shown in FIG. 5 comprises NAND circuits NA8 and NA9, NOT circuits NT8 and NT9, NOR circuits NR2 and NR3, and output stages I1 and I2 shown in FIG. 1.

Description is now made on the structure and operations of the control circuit 12 shown in FIG. 1.

Referring again to FIG. 1, the control circuit 12 comprises a PMOS transistor Q7 and an NMOS transistor Q8. A first conducting terminal of the PMOS transistor Q7 is connected to a point (node N3) on the data bus DB1 between the node N1 and the gate of the PMOS transistor Q5a. A first conducting terminal of the NMOS transistor Q8 is connected to a point (node N4) on the data bus DB2 between the node N2 and the gate of the NMOS transistor Q6a. A second conducting terminal of the PMOS transistor Q7 is connected to the internal power supply potential VCC, and its gate receives the output enable signal OE. On the other hand, a second conducting terminal of the NMOS transistor Q8 is connected to the ground potential VSS, and its gate receives an internal output enable signal /OE.

In the read operation (the output enable signal OE is at a high level), both the PMOS transistor Q7 and the NMOS transistor Q8 enter non-conducting states.

In a non-read operation (the output enable signal OE is at a low level), on the other hand, both the PMOS transistor Q7 and the NMOS transistor Q8 enter conducting states. Consequently, the node N3 is charged to the level of the internal power supply potential VCC, and its potential goes high. On the other hand, the node N4 is discharged to the level of the ground potential VSS, and its potential goes low.

With reference to the above description, a potential change of an external output signal VOUT in the semiconductor memory device 100 is now described.

When the memory block #1 is selected in a read operation (the output enable signal OE is at a high level), the PMOS transistor Q7 and the NMOS transistor Q8 forming the control circuit 12 enter non-conducting states, and the output stage 1 receives potential changes of the data buses DB1 and DB2.

When the data bus DB1 receives the first internal signal S1 of a low level (the internal read signal D is at a high level) and goes low, the external output signal VOUT loosely rises with a value decided by the capacitance of the data bus DB1. In this case, the potentials at the data buses DB1 and DB2 do not simultaneously go low and high respectively as hereinabove described, and hence no through current flows from the internal power supply potential VCC to the ground potential VSS.

When the data bus DB2 receives the second internal signal S2 of a high level (the internal read signal D is at a low level) and goes high, the external output signal VOUT loosely falls with a value decided by the capacitance of the data bus DB2. Also in this case, the potentials of the data buses DB1 and DB2 do not simultaneously go low and high respectively similarly to the above, and hence no through current flows from the internal power supply potential VCC to the ground potential VSS.

Figure 6A:
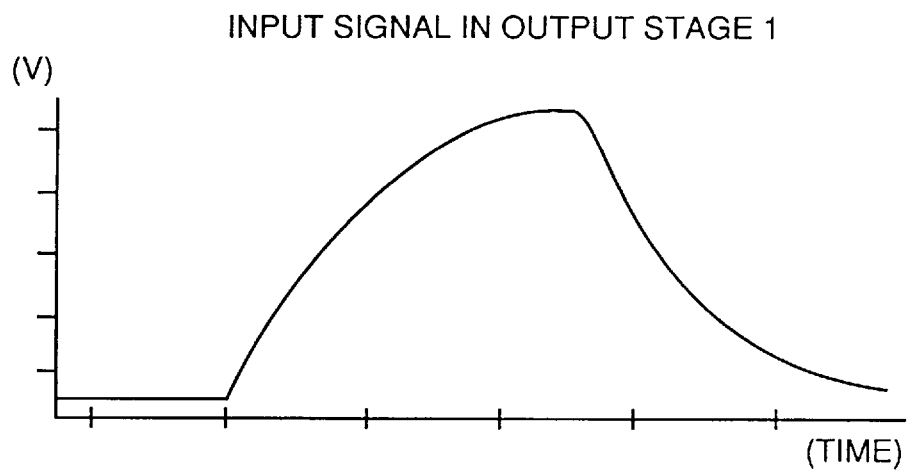
FIGS. 6A and 6B are signal waveform diagrams showing an input and an output of an output stage 1 according to the first embodiment respectively.
Figure 6B:
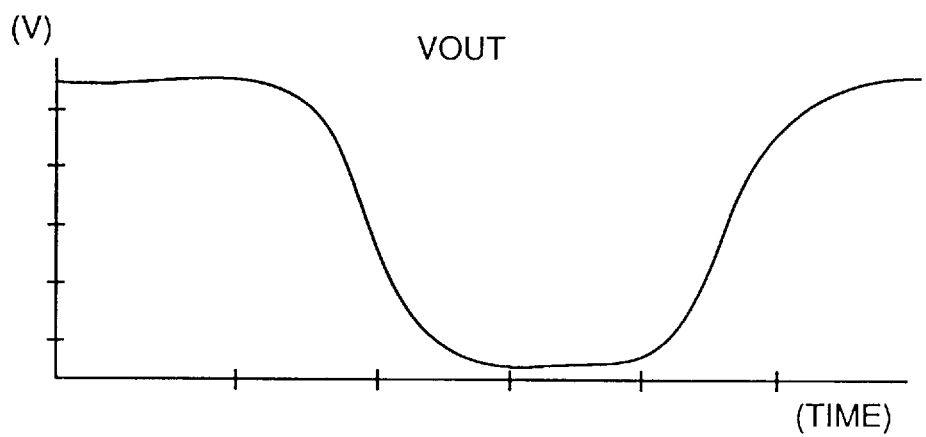

As shown in FIG. 6A, an input signal to the output stage 1 has a loose waveform. As shown in FIG. 6B, rise and fall times of the external signal VOUT are lengthened. In case of a non-read operation (the output enable signal OE is at a low level), the PMOS transistor Q7 enters a conducting state, the data bus DB1 is charged to the voltage level of the internal power supply potential VCC, and its potential goes high. The NMOS transistor Q8 enters a conducting state, the data bus DB2 is discharged to the voltage level of the ground potential VSS, and its potential goes low. Consequently, both the PMOS transistor Q5a and the NMOS transistor Q6a enter non-conducting states, and the node N0, i.e., the output pad P1 instantaneously enters a high impedance state.

Namely, according to the first embodiment of the present invention, the semiconductor memory device 100 can retard rise and fall times Tr and Tj of the waveform of the external output signal VOUT without changing the gate widths of the MOS transistors Q5a and Q6a forming the output stage 1 by utilizing the capacitances of the data buses DB1 and DB2 (through rate control). Due to the provision of the control circuit 12, further, the semiconductor memory device 100 can instantaneously set the potential at the output pad P1 in a high impedance state in a non-read operation. In addition, the semiconductor memory device 100 can displace the rise and fall timings of the signals transmitted through the data buses DB1 and DB2 respectively from each other as shown in FIGS. 3A to 3C and 4A to 4C, thereby preventing a through current in the output stage 1.

Second Embodiment

Figure 7:
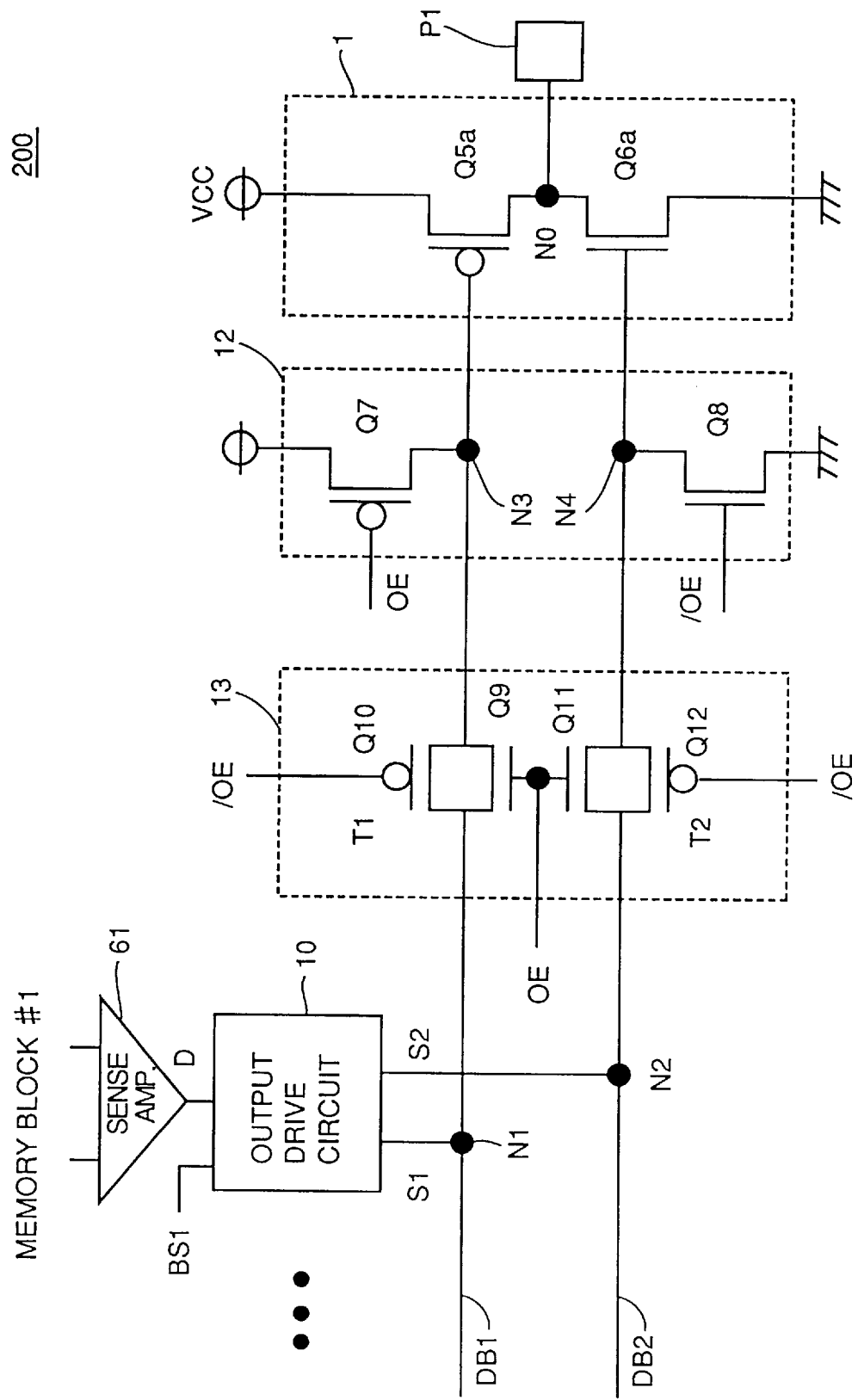
FIG. 7 is a block diagram schematically showing the structure of a principal part of a semiconductor memory device according to a second embodiment of the present invention.

With reference to FIG. 7, the system structure of a principal part of a semiconductor memory device 200 according to a second embodiment of the present invention is now described. Elements identical to those of the semiconductor memory device 100 shown in FIG. 1 are denoted by the same reference numerals and symbols, to omit redundant description.

The semiconductor memory device 200 according to the second embodiment is different from the conventional semiconductor memory device 900 in the following points:

The semiconductor memory device 200 shown in FIG. 7 comprises two data buses DB1 and DB2, in place of the data bus DB0 shown in FIG. 28. The semiconductor memory device 200 shown in FIG. 7 comprises an output drive circuit 10 and an output stage 1, in place of the output buffer circuit 50 shown in FIG. 28. In the embodiment shown in FIG. 7, the output drive circuit 10 and the output stage 1 are connected with each other through the data buses DB1 and DB2. The semiconductor memory device 200 shown in FIG. 7 further comprises a control circuit 12 for forcibly setting potentials on the data buses DB1 and DB2 at certain values. In the semiconductor memory device 200 shown in FIG. 7, a switching circuit 13 is provided between nodes N1 and N2 corresponding to connection points for the data buses DB1 and DB2 and two output nodes of the output drive circuit 10 and nodes N3 and N4 corresponding to connection points for the data buses DB1 and DB2 and the control circuit 12.

With reference to FIG. 7, the structure and operations of the semiconductor memory device 200 are now described.

The switching circuit 13 comprises multiplexers T1 and T2. The multiplexer T1 includes an NMOS transistor Q9 and a PMOS transistor Q10, and the multiplexer T2 includes an NMOS transistor Q11 and a PMOS transistor Q12. The gates of the PMOS transistors Q10 and Q12 receive an internal output enable signal /OE. The gates of the NMOS transistors Q9 and Q11 receive an output enable signal OE.

First and second conducting terminals of the multiplexer T1 (the NMOS transistor Q9 and the PMOS transistor Q10) are connected with the nodes N1 and N3 respectively through the data bus DB1. First and second conducting terminals of the multiplexer T2 (the NMOS transistor Q11 and the PMOS transistor Q12) are connected with the nodes N2 and N4 respectively through the data bus DB2.

In a read operation (the output enable signal OE is at a high level), both the multiplexers T1 and T2 enter conducting states. Therefore, the output stage 1 receives potential changes of the data buses DB1 and DB2, as hereinabove described. In a non-read operation (the output enable signal OE is at a low level), on the other hand, both the multiplexers T1 and T2 enter non-conducting states, and the nodes N1 and N2 are disconnected from the nodes N3 and N4.

Due to the provision of the switching circuit 13, the capacitances of the data buses DB1 and DB2 to be driven (charged or discharged) by the control circuit 12 at a point of time when the semiconductor memory device 200 is switched from a read operation to a non-read operation can be reduced. Consequently, the semiconductor memory device 200 can make transition of the state on the node N0 (from a potential state of a high or low level to a high impedance state), i.e., transition of the potential at an output pad P1, at a high speed.

Namely, according to the second embodiment of the present invention, the semiconductor memory device 200 can set the output pad P1 in a high impedance state at a high speed due to the provision of the switching circuit 13, in addition to the effect of the semiconductor memory device 100.

Third Embodiment

Figure 8:
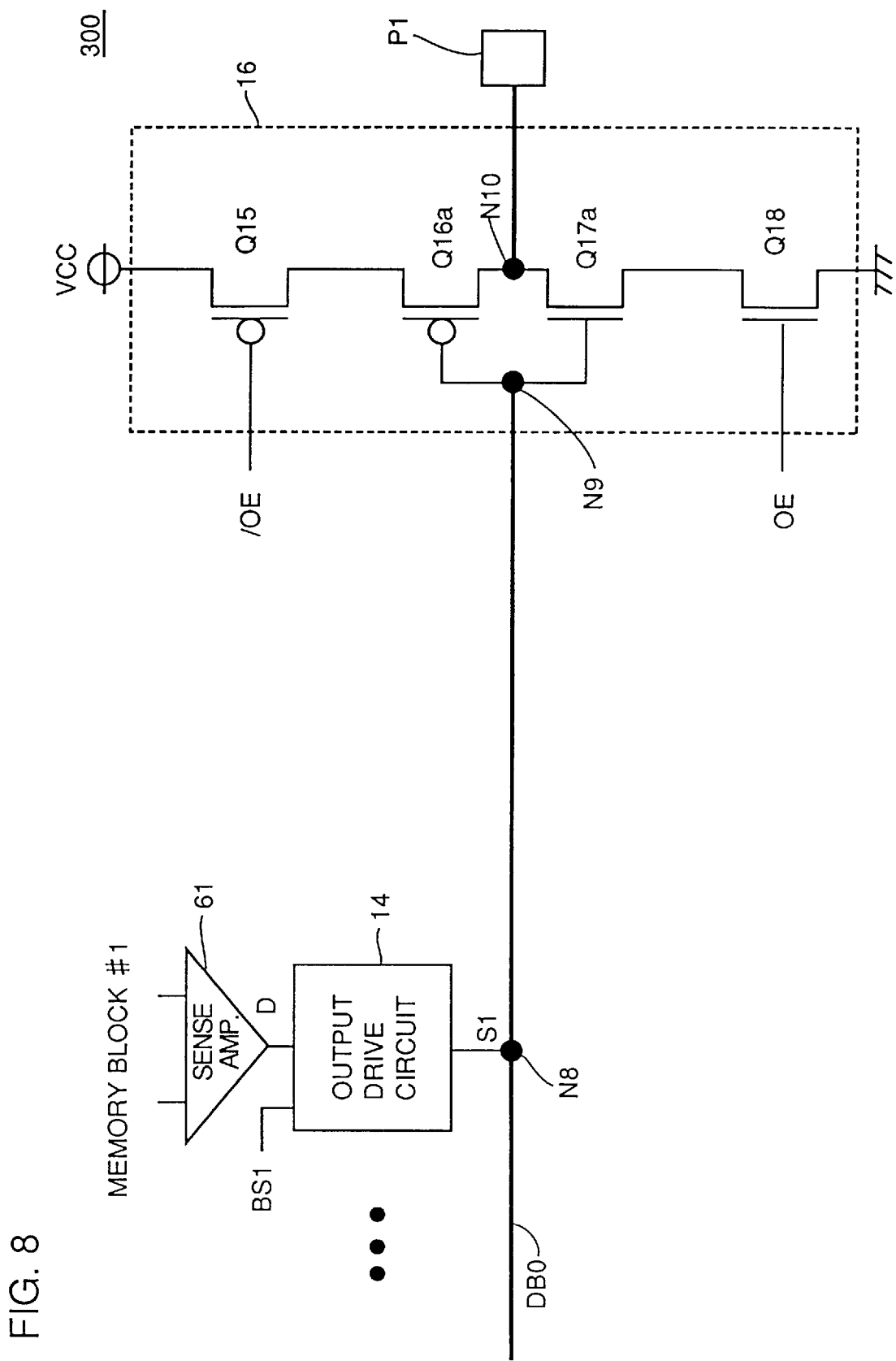
FIG. 8 is a block diagram schematically showing the structure of a principal part of a semiconductor memory device according to a third embodiment of the present invention.

With reference to FIG. 8, the system structure of a principal part of a semiconductor memory device 300 according to a third embodiment of the present invention is now described. Elements identical to those of the semiconductor memory device 900 shown in FIG. 28 are denoted by the same reference numerals and symbols, to omit redundant description.

The semiconductor memory device 300 according to the third embodiment is different from the conventional semiconductor memory device 900 in the following points: The semiconductor memory device 300 shown in FIG. 8 comprises an output drive circuit 14 and a clocked invertor 116 corresponding to an output final stage, in place of the output buffer circuit 50 shown in FIG. 28. In the embodiment shown in FIG. 8, the output drive circuit 14 and the clocked invertor 16 are connected with each other through a data bus DB0.

FIG. 8 representatively shows the relation between a sense amplifier 61 corresponding to a memory block #1 and the output drive circuit 14. An output node of the sense amplifier 61 is connected to an input node of the output drive circuit 14. An output node of the output drive circuit 14 is connected to a node N8 on the data bus DB0. An input node of the clocked invertor 16 is connected to a node N9 which is an end portion of the data bus DB0. An output node N10 of the clocked invertor 16 is connected to an output pad P1.

Figure 9:
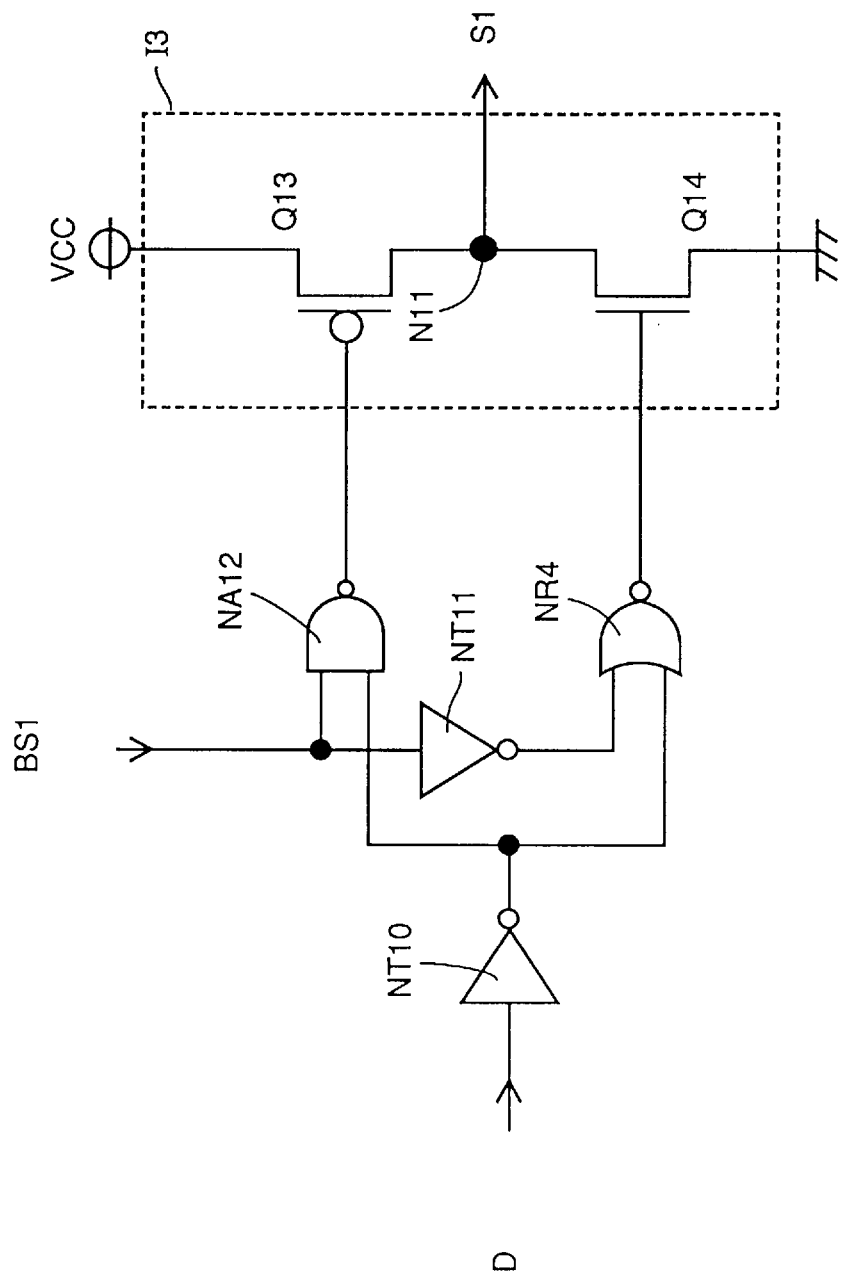
FIG. 9 is a circuit diagram schematically showing the structure of an output drive circuit according to the third embodiment.

FIG. 9 representatively shows the structure of the output drive circuit 14 which is connected with the sense amplifier 61 corresponding to the memory block #1. Referring to FIG. 9, the output drive circuit 14 comprises a NAND circuit NA12, NOT circuits NT10 and NT11, a NOR circuit NR4 and an output stage I3. The NOT circuit NT10 receives an internal read signal D from the sense amplifier 61, and inverts the same (/D). The NOT circuit NT11 receives a block selection signal BS1, and inverts the same (/BS1). The NAND circuit NA12 receives the block selection signal BS1 and the signal /D outputted from the NOT circuit NT10. On the other hand, the NOR circuit NR4 receives the signal /BS1 outputted from the NOT circuit NT11 and the signal /D outputted from the NOT circuit NT10.

A PMOS transistor Q13 forming the output stage I3 has a gate which is connected to an output node of the NAND circuit NA12. An NMOS transistor Q14 has a gate which is connected to an output node of the NOR circuit NR4. An internal signal S1 is transmitted from a node N11 corresponding to a connection point between the PMOS transistor Q13 and the NMOS transistor Q14 to a node N8 on the data bus DB0.

Operations of the output drive circuit 14 shown in FIG. 9 are now described. With reference to FIGS. 10A to 10C, an operation in case of receiving the internal read signal D of a high level from the sense amplifier 61 is described. It is assumed that the block selection signal BS1 is at a high level.

The NAND circuit NA12 receives the block selection signal BS1 of a high level and the signal /D of a low level outputted from the NOT circuit NT10, and outputs a signal of a high level. On the other hand, the NOR circuit NR4 receives the signal /BS1 of a low level outputted from the NOT circuit NT11 and the signal /D of a low level outputted from the NOT circuit NT10, and outputs a signal of a high level. Therefore, the PMOS transistor Q13 and the NMOS transistor Q14 enter non-conducting and conducting states respectively. In response to this, the node N11 is discharged to the level of a ground potential VSS. Consequently, the potential of the internal signal S1 goes low.

An operation in case of receiving the internal read signal D of a low level from the sense amplifier 61 is now described.

Referring to FIGS. 11A to 11C, the NAND circuit NA12 receives the block selection signal BS1 of a high level and the signal /D of a high level outputted from the NOT circuit NT10, and outputs a signal of a low level. On the other hand, the NOR circuit NR4 receives the signal /BS1 of a low level outputted from the NOT circuit NT11 and the signal /D of a high level outputted from the NOT circuit NT10, and outputs a signal of a low level. Therefore, the PMOS transistor Q13 and the NMOS transistor Q14 enter conducting and non-conducting states respectively. In response to this, the node N11 is charged to the level of an internal power supply potential VCC. Consequently, the potential of the internal signal S1 goes high.

When the block selection signal BS1 is at a low level, on the other hand, the NAND circuit NA12 outputs a signal of a high level, and the NOR circuit NR4 outputs a signal of a low level. In response to this, the PMOS transistor Q13 and the NMOS transistor Q14 enter non-conducting states. Consequently, the node N11 enters a high impedance state.

Figure 12:
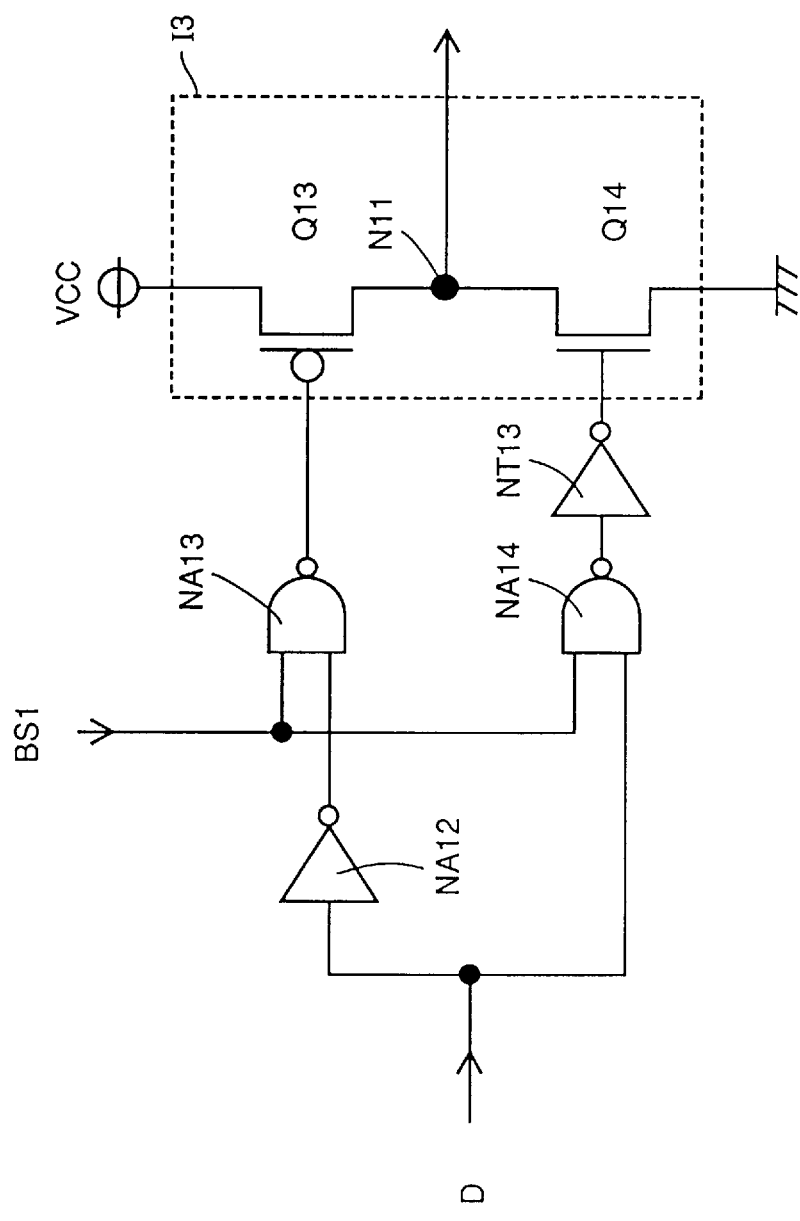
FIG. 12 is a circuit diagram schematically showing another structure of the output drive circuit according to the third embodiment.

The same effect as the above is obtained by substituting another output drive circuit 15 shown in FIG. 12 for the output drive circuit 14. The output drive circuit 15 shown in FIG. 12 comprises NAND circuits NA13 and NA14, NOT circuits NT12 and NT13, and an output stage I3.

The structure and operations of the clocked invertor 16 are now described. The clocked invertor 16 outputs a signal of a high level, a low level, or a high impedance (non-read state) value. Referring again to FIG. 8, the clocked invertor 16 comprises PMOS transistors Q15 and Q16a and NMOS transistors Q17a and Q18. First and second conducting terminals of the PMOS transistor Q15 are connected to the internal power supply potential VCC and a first conducting terminal of the PMOS transistor Q16a respectively. Its gate receives an internal output enable signal /OE. First and second conducting terminals of the NMOS transistor Q18 are connected to the ground potential VSS and a first conducting terminal of the NMOS transistor Q17a respectively. Its gate receives an internal output enable signal OE. A node N10 corresponding to a connection point between the PMOS transistor Q16a and the NMOS transistor Q17a is connected to an output pad P1. The respective gates of the PMOS transistor Q16a and the NMOS transistor Q17a are connected to a node N9 which is an end portion of the data bus DB0.

Both the PMOS transistor Q15 and the NMOS transistor Q18 conduct when the output enable signal OE is at a high level (i.e., the internal output enable signal /OE is at a low level). In this case, the first conducting terminal of the PMOS transistor Q16a is charged to the level of the internal power supply potential VCC, and that of the NMOS transistor Q17a is discharged to the level of the ground potential VSS.

With reference to the above description, a potential change of an external output signal VOUT in the semiconductor memory device 300 is now described. In a read operation (the output enable signal OE is at a high level), the data bus DB0 receives the internal signal S1 of a low level (the internal read signal D is at a high level) and its potential goes low, and the PMOS transistor Q16a and the NMOS transistor Q17a enter conducting and non-conducting states respectively. In this case, the node N10 is charged to the level of the internal power supply potential VCC. Consequently, the potential of the external output signal VOUT loosely goes high with a value decided by the capacitance of the data bus DB0.

When the data bus DB0 receives the internal signal S1 of a high level (the internal read signal D is at a low level) and goes high, on the other hand, the PMOS transistor Q16a and the NMOS transistor Q17a enter non-conducting and conducting states respectively. In this case, the node N10 is discharged to the level of the ground potential VSS. Consequently, the external output signal VOUT loosely goes low with a value decided by the capacitance of the data bus DB0.

Figure 13A:
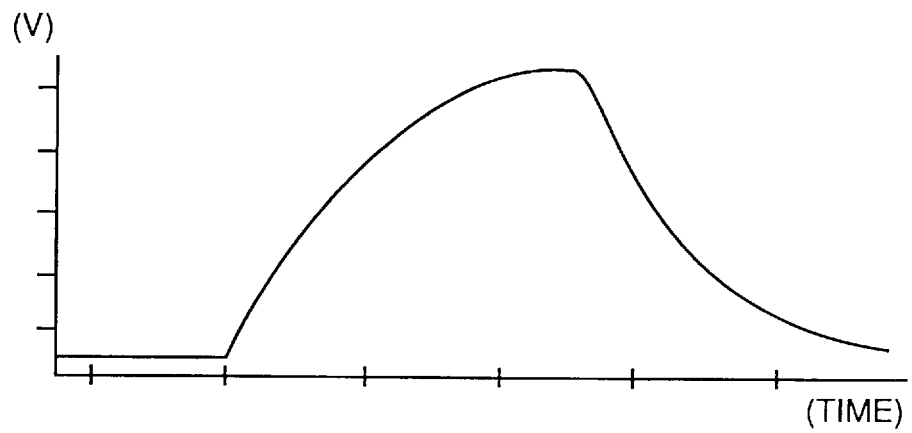
FIGS. 13A and 13B are signal waveform diagrams showing an input and an output of a clocked invertor according to the third embodiment respectively.
Figure 13B:
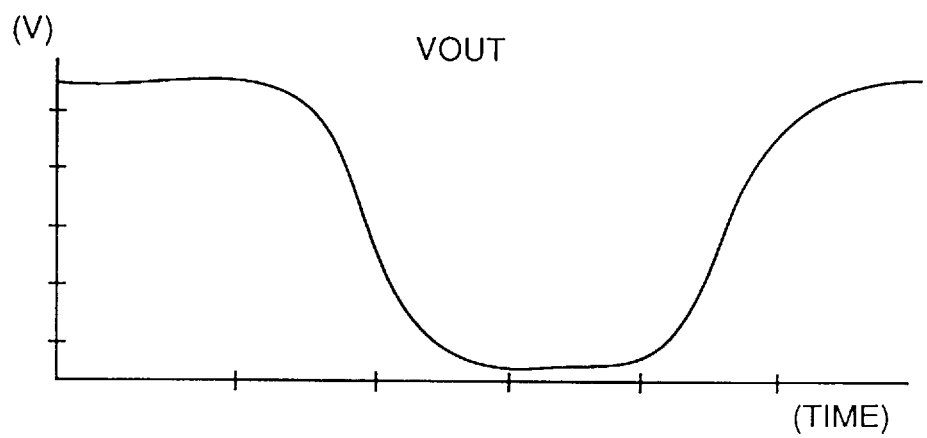

With reference to simulation results shown in FIGS. 13A and 13B, an effect of the embodiment 3 according to the present invention is now described. FIGS. 13A and 13B show the relation between an input signal to the clocked invertor 16 corresponding to the internal read signal D of a high level and the external output signal VOUT.

As shown in FIGS. 13A and 13B, the input signal to the clocked invertor 16 has a loose waveform. Further, rise and fall times of the external output signal VOUT are lengthened. In a non-read operation (the output enable signal OE is at a low level), on the other hand, the PMOS transistor Q16a and the NMOS transistor Q17a enter non-conducting states. Consequently, the voltage level of the node N10 (the output pad P1) instantaneously enters a high impedance state.

Namely, according to the third embodiment of the present invention, the semiconductor memory device 300 can retard rise and fall times Tr and Tj without changing the gate widths of the MOS transistors forming the output final stage by utilizing the capacitance of the data bus DB0 (through rate control). Further, the semiconductor memory device 300 utilizes only one data bus DB0, whereby the chip area can be suppressed.

Due to the provision of the clocked invertor 16, further, the semiconductor memory device 300 can instantaneously set the potential of the output pad P1 in a high impedance state in a non-read operation.

Fourth Embodiment

Figure 14:
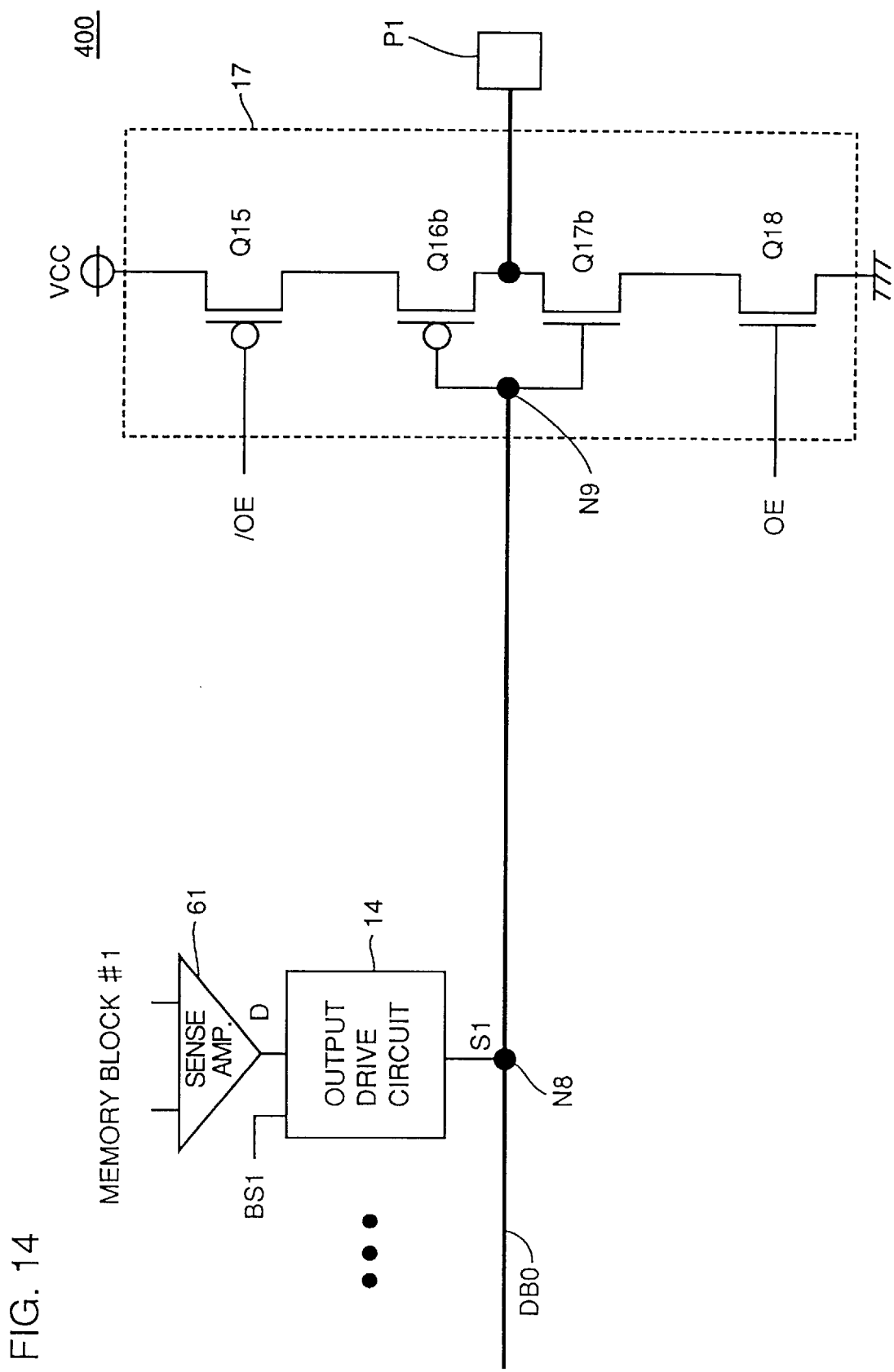
FIG. 14 is a block diagram schematically showing the structure of a principal part of a semiconductor memory device according to a fourth embodiment of the present invention.

With reference to FIG. 14, the system structure of a principal part of a semiconductor memory device 400 according to a fourth embodiment of the present invention is now described. Elements identical to those of the semiconductor memory device 300 shown in FIG. 8 are denoted by the same reference numerals and symbols, to omit redundant description.

The semiconductor memory device 400 according to the fourth embodiment is different from the conventional semiconductor device 900 in the following points: The semiconductor memory device 400 shown in FIG. 14 comprises an output drive circuit 14 and a clocked invertor 17 corresponding to an output final stage, in place of the output buffer circuit 50 shown in FIG. 28. In the embodiment shown in FIG. 14, the output drive circuit 14 and the clocked invertor 17 are connected with each other through a data bus DB0. The embodiment shown in FIG. 14 employs MOS transistors having threshold voltages which are different from those of generally employed ones, for forming the clocked invertor 17.

The clocked invertor 17 utilizes a PMOS transistor Q16b and an NMOS transistor Q17b in place of the PMOS transistor Q16a and the NMOS transistor Q17a of the clocked invertor 16 forming the semiconductor memory device 300 respectively.

The relation between threshold voltages Vthp and Vthn of the PMOS transistor Q16b and the NMOS transistor Q17b is as follows:

$$VCC-|Vthp|<Vthn' \quad (1)$$

With reference to FIGS. 15A and 15B, operating states of the clocked invertor 16 forming the semiconductor memory device 300 are described. Referring to FIGS. 15A and 15B, the solid line shows the transition relation between conducting (ON) and non-conducting (OFF) states of the PMOS transistor Q16a, and the broken line shows the transition relation between conducting and non-conducting states of the NMOS transistor Q17a. The threshold values Vthp and Vthn of the PMOS transistor Q16a and the NMOS transistor Q17a, which are MOS transistors generally employed in a semiconductor memory device, are about −0.8 V and about 0.8 V respectively. The relation between the threshold voltages Vthp and Vthn satisfies the following expression (2):

$$Vthn<VCC-|Vthp| \quad (2)$$

With reference to FIGS. 16A and 16B, on the other hand, operating states of the clocked invertor 17 forming the semiconductor memory device 400 are now described. Referring to FIGS. 16A and 16B, the solid line shows the transition relation between conducting and non-conducting states of the PMOS transistor Q16b, and the broken line shows the transition relation between conducting and non-conducting states of the NMOS transistor Q17b. The expression (2) holds in the clocked invertor 16 forming the semiconductor memory device 300, and hence both the PMOS transistor Q16a and the NMOS transistor Q17a enter conducting states when a voltage V applied to the gates thereof satisfies Vthn<V<VCC−|Vthp| (see FIGS. 15A and 15B). Therefore, a through current disadvantageously flows from the internal power supply potential VCC to the ground potential VSS. On the other hand, the expression (1) holds in the clocked invertor 17 forming the semiconductor memory device 400, and hence the PMOS transistor Q16b and the NMOS transistor Q17b do not simultaneously enter conducting states (see FIGS. 16A and 16B). Thus, a through current can be prevented.

Namely, according to the fourth embodiment of the present invention, the semiconductor memory device 400 can further prevent the MOS transistors from a through current, in addition to the effect of the semiconductor memory device 300.

Fifth Embodiment

With reference to FIG. 17, the system structure of a principal part of a semiconductor memory device 500 according to a fifth embodiment of the present invention is described. Elements identical to those of the semiconductor memory device 300 shown in FIG. 8 are denoted by the same reference numerals and symbols, to omit redundant description.

The semiconductor memory device 500 according to the fifth embodiment is different from the conventional semiconductor memory device 900 in the following points: The semiconductor memory device 500 shown in FIG. 17 comprises an output drive circuit 14 and a clocked invertor 18 corresponding to an output final stage, in place of the output buffer circuit 50 shown in FIG. 28. In the embodiment shown in FIG. 17, the output drive circuit 14 and the clocked invertor 18 are connected with each other through a data bus DB0.

The structure and operations of the semiconductor memory device 500 are now described. Referring to FIG. 17, the clocked invertor 18 comprises PMOS transistors Q19a and Q20, and NMOS transistors Q21 and Q22a. First and second conducting terminals of the PMOS transistor Q19a are connected to an internal power supply potential VCC and a first conducting terminal of the PMOS transistor Q20 respectively. First and second conducting terminals of the NMOS transistor Q22a are connected to a ground potential VSS and a first conducting terminal of the NMOS transistor Q21 respectively. The respective gates of the PMOS transistor Q19a and the NMOS transistor Q22a are connected to the data bus DB0 at a node N9. Second conducting terminals of the PMOS transistor Q20 and the NMOS transistor Q21 are connected to an output pad P1 at a node N13. The gates of the PMOS transistor Q20 and the NMOS transistor Q21 receive an internal output enable signal /OE and an output enable signal OE respectively.

Both the PMOS transistor Q20 and the NMOS transistor Q21 conduct when the internal output enable signal /OE is at a low level (the output enable signal OE is at a high level). If the potential on the node N9 is at a low level, the first conducting terminal of the PMOS transistor Q20 is charged to the level of the internal power supply potential VCC. If the potential on the node N9 is at a high level, on the other hand, the first conducting terminal of the NMOS transistor Q21 is discharged to the level of the ground potential VSS.

With reference to the above description, a potential change of an external output signal VOUT at the output pad P1 of the semiconductor memory device 500 is now described. In a read operation (the output enable signal /OE is at a low level), the potential at the data bus DB0 receiving an internal signal S1 of a low level (an internal read signal D is at a high level) goes low, and the PMOS transistor Q19a and the NMOS transistor Q22a enter conducting and non-conducting states respectively. In this case, the node N13 is loosely charged to the level of the internal power supply potential VCC with a value decided by the capacitance of the data bus DB0. Consequently, the potential of the external output signal VOUT loosely goes high with a value decided by the capacitance of the data bus DB0.

When the potential of the data bus DB0 receiving the internal signal S1 of a high level (the internal read signal D is at a low level) goes high, on the other hand, the PMOS transistor Q19a and the NMOS transistor Q22a enter non-conducting and conducting states respectively. In this case, the node N13 is loosely discharged to the level of the ground potential VSS with a value decided by the capacitance of the data bus DB0. Consequently, the potential of the external output signal VOUT loosely goes low with a value decided by the capacitance of the data bus DB0. In a non-read operation (the internal output enable signal /OE is at a high level), on the other hand, the PMOS transistor Q20 and the NMOS transistor Q21 enter non-conducting states. Consequently, the voltage level of the node N13 (the output pad P1) instantaneously enters a high impedance state.

The potential level of a signal transmitted on an external wire is also fluctuated by a load connected to the external wire. If the semiconductor memory device 500 is connected onto an external wire and its output pad P1 is in a high impedance state, it can be regarded that only a load corresponding to the output pin capacitance of the semiconductor memory device 500 is connected onto the external wire.

In the semiconductor memory device 300, on the other hand, the output pin capacitance is equal to a value obtained by adding the capacitances of the PMOS transistor Q16a and the NMOS transistor Q17a (or the PMOS transistor Q16b and the NMOS transistor Q17b in the semiconductor memory device 400) to the capacitance of the output pin, due to its structure. When the semiconductor memory device 300 is employed, therefore, the load connected onto the external wire is increased to dull waveforms of the transmitted signals. When the semiconductor memory device 500 is employed, on the other hand, the load on the external wire can be suppressed to exert less influence on the waveforms of the transmitted signals.

Namely, according to the fifth embodiment of the present invention, the semiconductor memory device 500 can further suppress the output pin capacitance, in addition to the effect of the semiconductor memory device 300.

Sixth Embodiment

Figure 18:
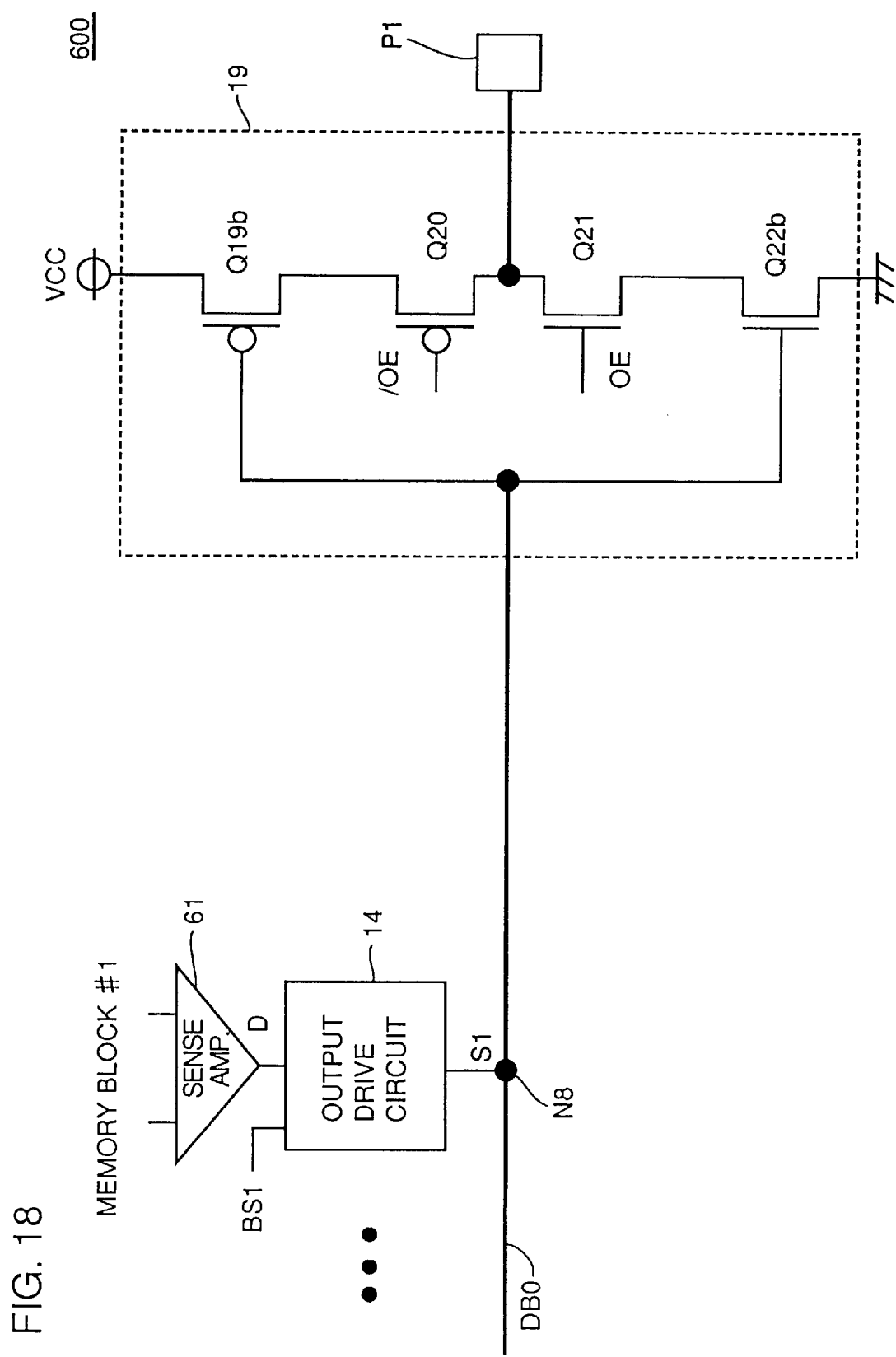
FIG. 18 is a block diagram schematically showing the structure of a principal part of a semiconductor memory device according to a sixth embodiment of the present invention.

With reference to FIG. 18, the system structure of a principal part of a semiconductor memory device 600 according to a sixth embodiment of the present invention is described. Elements identical to those of the semiconductor memory device 500 shown in FIG. 17 are denoted by the same reference numerals and symbols, to omit redundant description.

The semiconductor memory device 600 according to the sixth embodiment is different from the conventional semiconductor memory device 900 in the following points: The semiconductor memory device 600 shown in FIG. 18 comprises an output drive circuit 14 and a clocked invertor 19 corresponding to an output final stage, in place of the output buffer circuit 50 shown in FIG. 28. In the embodiment shown in FIG. 18, the output drive circuit 14 and the clocked invertor 19 are connected with each other through a data bus DB0. The embodiment shown in FIG. 18 employs MOS transistors having threshold voltages which are different from those of ordinary ones for forming the clocked invertor 19.

Referring to FIG. 18, the clocked invertor 19 utilizes a PMOS transistor Q19b and an NMOS transistor Q22b in place of the PMOS transistor Q19a and the NMOS transistor Q22a of the clocked invertor 18 forming the semiconductor memory device 500 shown in FIG. 17.

Threshold voltages Vthp and Vthn of the PMOS transistor Q19b and the NMOS transistor Q22b are in the relation shown in the expression (1).

Figure 19A:
FIGS. 19A and 19B are signal waveform diagrams showing conducting and non-conducting states of MOS transistors respectively for illustrating an effect of the sixth embodiment.
Figure 19B:

With reference to FIGS. 19A and 19B, operating states of the clocked invertor 18 forming the semiconductor memory device 500 are now described. Referring to FIGS. 19A and 19B, the solid line shows the transition relation between conducting and non-conducting states of the PMOS transistor Q19a, and the broken line shows the transition relation between conducting and non-conducting states of the NMOS transistor Q22a. The threshold voltages Vthp and Vthn of the PMOS transistor Q19a and the NMOS transistor Q22a, which are MOS transistors generally employed in a semiconductor memory device, are about −0.8 V and about 0.8 V respectively. The relation between the threshold voltages Vthp and Vthn satisfies the expression (2).

Figure 20A:
FIGS. 20A and 20B are signal waveform diagrams showing conducting and non-conducting states of the MOS transistors respectively for illustrating another effect of the sixth embodiment.
Figure 20B:

With reference to FIGS. 20A and 20B, on the other hand, operating states of the clocked invertor 19 forming the semiconductor memory device 600 are described. Referring to FIGS. 20A and 20B, the solid line shows the transition relation between conducting and non-conducting states of the PMOS transistor Q19b, and the broken line shows the transition relation between conducting and non-conducting states of the NMOS transistor Q22b.

The expression (2) holds in the clocked invertor 18 forming the semiconductor memory device 500, and hence both the PMOS transistor Q19a and the NMOS transistor Q22a enter conducting states when a voltage V applied to the gates thereof satisfies Vthn<V<VCC−|Vthp| (see FIGS. 19A and 19B). Therefore, a through current disadvantageously flows from the internal power supply potential VCC to the ground potential VSS in a read operation.

On the other hand, the expression (1) holds in the ground invertor 19 forming the semiconductor memory device 600, and hence the PMOS transistor Q19b and the NMOS transistor Q22b do not simultaneously enter conducting states (see FIGS. 20A and 20B). Thus, a through current can be prevented.

Namely, according to the sixth embodiment of the present invention, the semiconductor memory device 600 can further suppress the MOS transistors from a through current, in addition to the effect of the semiconductor memory device 500 according to the fifth embodiment.

Seventh Embodiment

Figure 21:
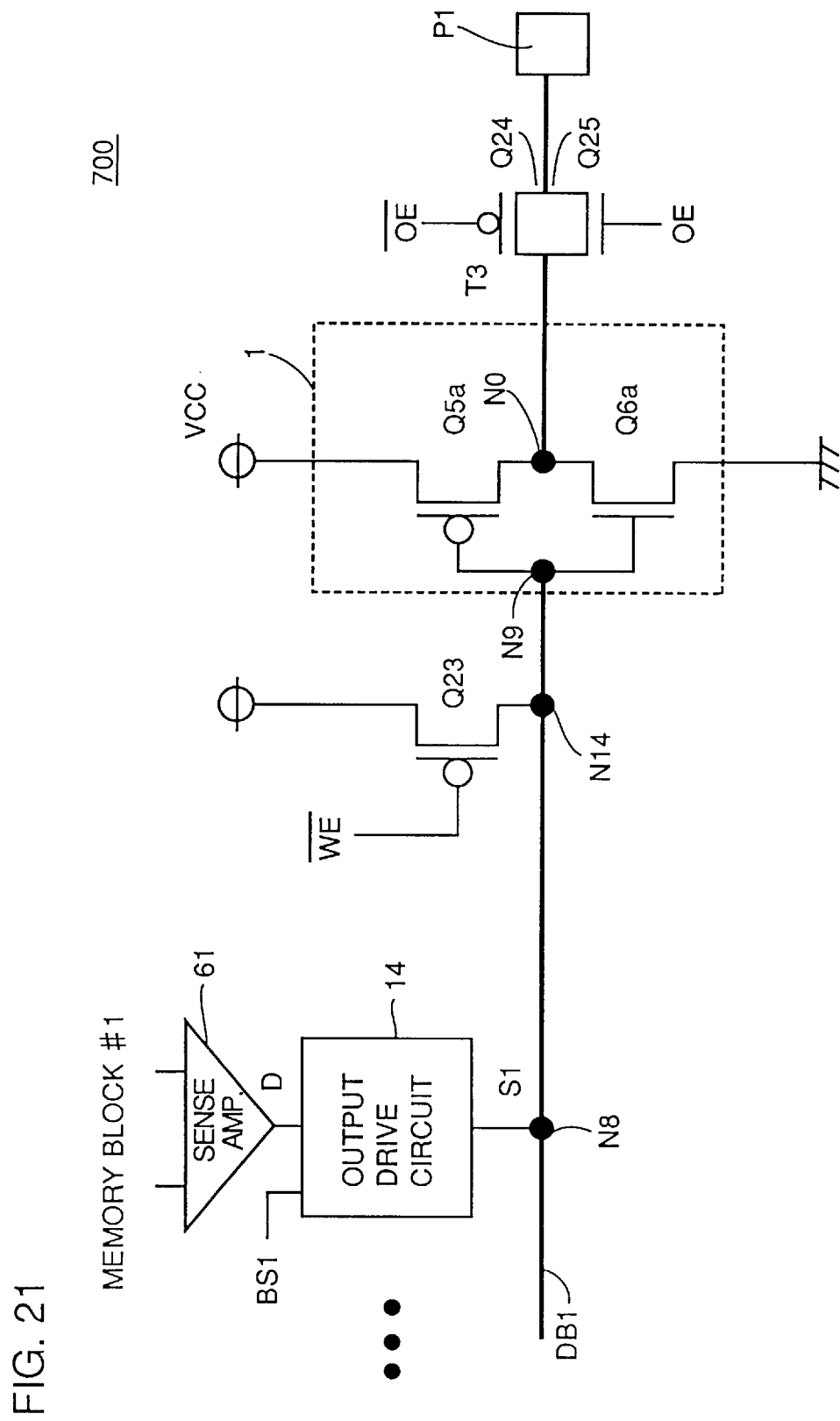
FIG. 21 is a block diagram schematically showing the structure of a principal part of a semiconductor memory device according to a seventh embodiment of the present invention.

With reference to FIG. 21, the system structure of a principal part of a semiconductor memory device 700 according to a seventh embodiment of the present invention is described. Elements identical to those of the conventional semiconductor memory device 900 shown in FIG. 28 are denoted by the same reference numerals and symbols, to omit redundant description.

The semiconductor memory device 700 according to the seventh embodiment is different from the conventional semiconductor memory device 900 in the following points: The semiconductor memory device 700 shown in FIG. 21 comprises an output drive circuit 14 and an output stage 1, in place of the output buffer circuit 50 shown in FIG. 28. In the embodiment shown in FIG. 21, the output drive circuit 14 and the output stage 1 are connected with each other through a data bus DB0. The semiconductor memory device 700 shown in FIG. 21 comprises a multiplexer T3 between an output node N0 of the output stage 1 and an output pad P1.

With reference to FIG. 21, the structure and operations of the semiconductor memory device 700 are now described. An input node of the output stage 1 is connected with a node N9 corresponding to an end portion of the data bus DB0. The multiplexer T3 comprises a PMOS transistor Q24 and an NMOS transistor Q25. First and second conducting terminals of the PMOS transistor Q24 are connected to the node N0 of the output stage 1 and the output pad P1 respectively. First and second conducting terminals of the NMOS transistor Q25 are also connected to the node N0 of the output stage 1 and the output pad P1 respectively. The gates of the PMOS transistor Q24 and the NMOS transistor Q25 receive an internal output enable signal /OE and an output enable signal OE respectively.

Both the PMOS transistor Q24 and the NMOS transistor Q25 conduct when the internal output enable signal /OE is at a low level (the output enable signal OE is at a high level). In this case, an output of the output stage 1 is transmitted to the output pad P1 as such. When the internal output enable signal /OE is at a high level (the output enable signal OE is at a low level), on the other hand, the PMOS transistor Q24 and the NMOS transistor Q25 enter non-conducting states. In this case, the output of the output stage 1 is not transmitted to the output pad P1.

With reference to the above description, a potential change of an external output signal VOUT in the semiconductor memory device 700 is described.

In a read operation (the output enable signal /OE is at a low level), the potential at the data bus DB0 receiving an internal signal S1 of a low level (an internal read signal D is at a high level) goes low, and the node N0 is loosely charged to the level of the internal power supply potential VCC with a value decided by the capacitance of the data bus DB0. Consequently, the potential of the external output signal VOUT loosely goes high with a value decided by the capacitance of the data bus DB0.

When the potential at the data bus DB0 receiving the internal signal S1 of a high level (the internal read signal D is at a low level) goes high, on the other hand, the node N0 is loosely discharged to the level of the ground potential VSS with a value decided by the capacitance of the data bus DB0. Consequently, the potential of the external output signal VOUT loosely goes low with a value decided by the capacitance of the data bus DB0. In a non-read operation (the internal output enable signal /OE is at a high level), on the other hand, the voltage level of the node N0 (the output pad P1) instantaneously enters a high impedance state.

While the PMOS transistor Q15 and the NMOS transistor Q18 or the PMOS transistor Q20 and the NMOS transistor Q21 of the clocked invertors 16 to 19 in the semiconductor memory devices 300 to 500 have functions of bringing the output pads 1 into a high impedance state at a high speed in a non-read operation similarly to the multiplexer T3, the transistor size of the multiplexer T3 may be half that of these MOS transistors.

Namely, according to the seventh embodiment of the present invention, the semiconductor memory device 700 can retard rise and fall times Tr and Tj without changing the gate widths of the MOS transistors forming the output final stage by utilizing the capacitance of the data bus DB0 (through rate control).

Further, the semiconductor memory device 700 utilizes only one data bus DB0, whereby the chip area can be suppressed.

Due to the provision of the multiplexer T3, further, the semiconductor memory device 700 can instantaneously set the potential of the output pad P1 in a high impedance state in a non-read operation. In addition, this effect can be implemented with a MOS transistor having a small transistor size, whereby the chip area can be suppressed.

Eighth Embodiment

Figure 22:
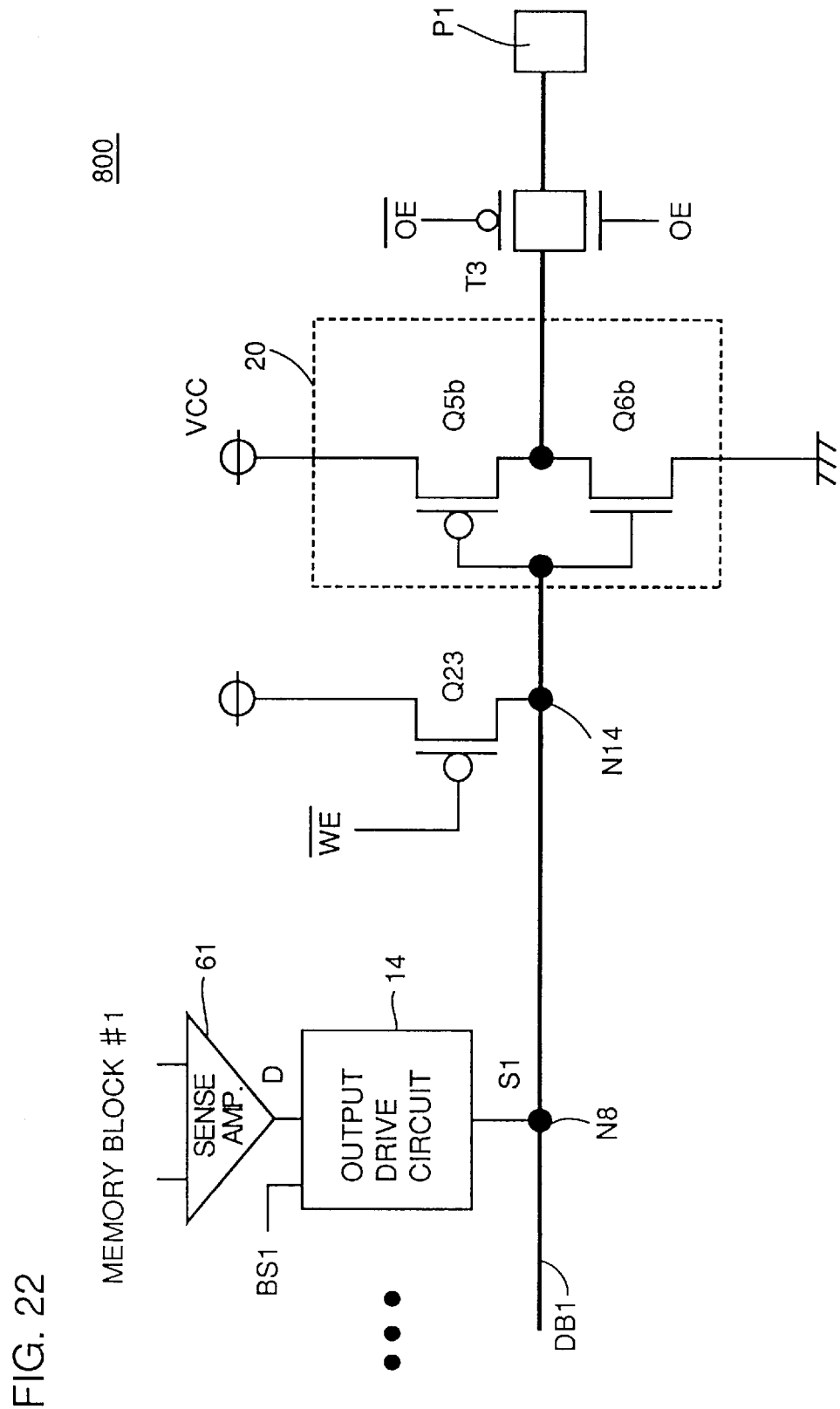
FIG. 22 is a block diagram schematically showing the structure of a principal part of a semiconductor memory device according to an eighth embodiment of the present invention.
Figure 25:
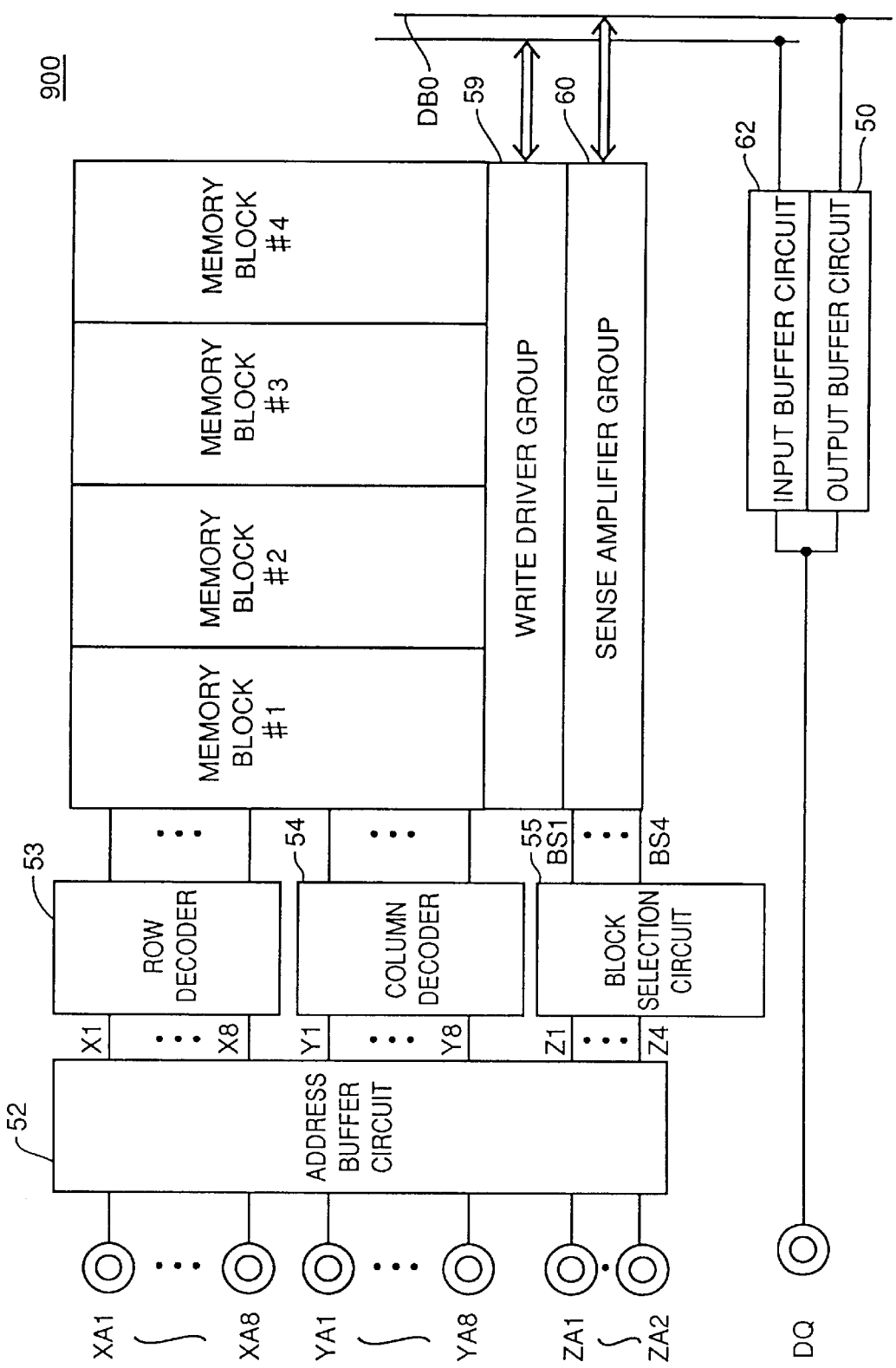
FIG. 25 is a block diagram schematically showing the structure of a conventional semiconductor memory device.
Figure 26:
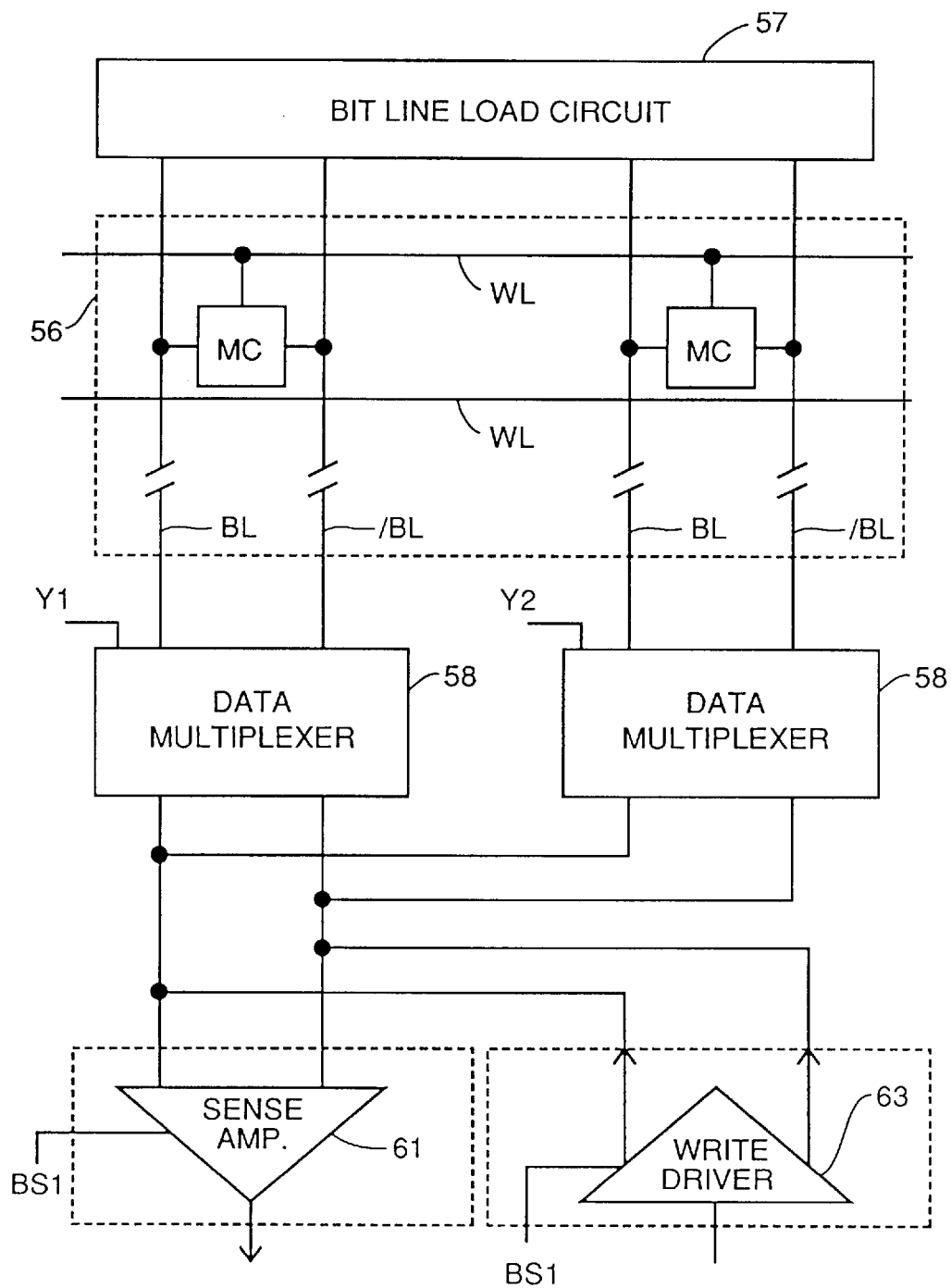
FIG. 26 is a circuit diagram for illustrating the structure of each memory block in the conventional semiconductor memory device.
Figure 27:
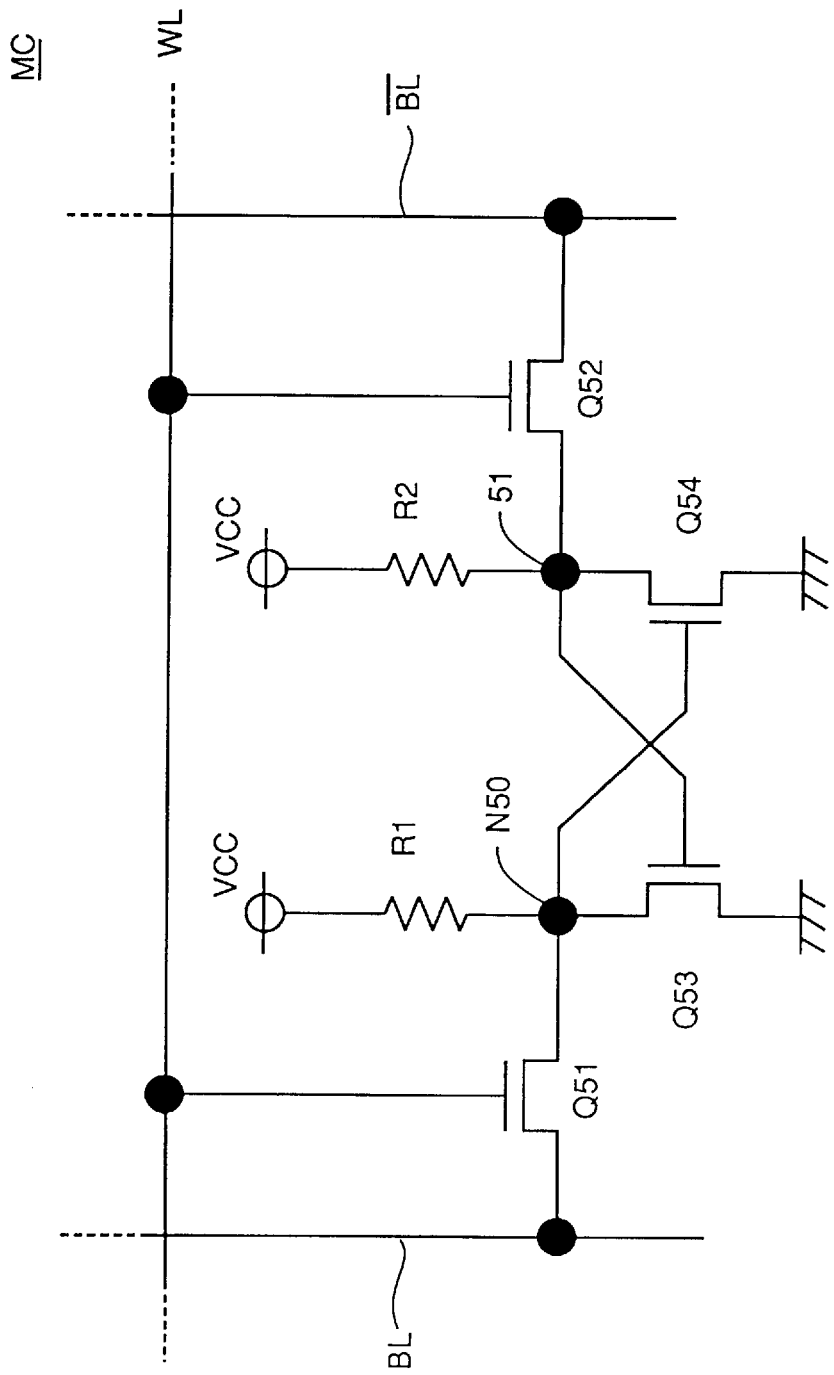
FIG. 27 is a circuit diagram schematically showing the structure of each memory cell in the conventional semiconductor memory device.

With reference to FIG. 22, the system structure of a principal part of a semiconductor memory device 800 according to an eighth embodiment of the present invention is described. Elements identical to those of the conventional semiconductor memory device 900 shown in FIG. 28 are denoted by the same reference numerals and symbols, to omit redundant description.

The semiconductor memory device 800 according to the eighth embodiment is different from the conventional semiconductor memory device 900 in the following points: The semiconductor memory device 800 shown in FIG. 22 comprises an output drive circuit 14 and an output stage 20 corresponding to an output final stage, in place of the output buffer circuit 50 shown in FIG. 28. In the embodiment shown in FIG. 22, the output drive circuit 14 and the output stage 20 are connected with each other through a data bus DB0. The semiconductor memory device 800 shown in FIG. 22 comprises a multiplexer T3 between the output stage 20 and an output pad P1. The embodiment shown in FIG. 22 employs MOS transistors having threshold voltages which are different from those of generally employed ones for forming the output stage 20.

Referring to FIG. 22, the output stage 20 employs a PMOS transistor Q5$b$ and an NMOS transistor Q6$b$ in place of the PMOS transistor Q5$a$ and the NMOS transistor Q6$a$ of the output stage 1 forming the conventional semiconductor memory device 900 shown in FIG. 28.

Threshold voltages Vthp and Vthn of the PMOS transistor Q5$b$ and the NMOS transistor Q6$b$ are in the relation shown in the expression (1).

With reference to FIGS. 23A and 23B, operating states of the output stage 1 forming the semiconductor memory device 900 are now described. Referring to FIGS. 23A and 23B, the solid line shows the transition relation between conducting (ON) and non-conducting (OFF) states of the PMOS transistor Q5$a$, and the broken line shows the transition relation between conducting and non-conducting states of the NMOS transistor Q6$a$. Threshold voltages Vthp and Vthn of the PMOS transistor Q5$a$ and the NMOS transistor Q6$a$, which are MOS transistors generally employed in a semiconductor memory device, are about −0.8 V and about 0.8 V respectively. The relation between the threshold voltages Vthp and Vthn satisfies the expression (2).

With reference to FIGS. 24A and 24B, on the other hand, operating states of the output stage 20 forming the semiconductor memory device 800 are described. Referring to FIGS. 24A and 24B, the solid line shows the transition relation between conducting and non-conducting states of the PMOS transistor Q5$b$, and the broken line shows the transition relation between conducting and non-conducting states of the NMOS transistor Q6$b$.

The expression (2) holds in the output stage 1 forming the semiconductor memory device 900, and hence both the PMOS transistor Q5$a$ and the NMOS transistor Q6$a$ enter conducting states when a voltage V applied to the gates thereof satisfies Vthn<V<VCC−|Vthp| (see FIGS. 23A and 23B). Therefore, a through current disadvantageously flows from the internal power supply potential VCC to the ground potential VSS.

On the other hand, the expression (1) holds in the output stage 20 forming the semiconductor memory device 800, and hence the PMOS transistor Q5$b$ and the NMOS transistor Q6$b$ do not simultaneously enter conducting states (see FIGS. 24A and 24B). Thus, a through current can be prevented.

Namely, according to the eighth embodiment of the present invention, the semiconductor memory device 800 can prevent the MOS transistors from a through current, in addition to the effect of the semiconductor memory device 700 according to the seventh embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device applying an output signal to an external load at an output terminal, said semiconductor memory device, comprising:

a transmission line;

a drive circuit coupled to said transmission line for adjusting the potential at said transmission line in response to an internal signal read from a selected memory cell in a read operation mode; and an output signal generation circuit, including an output stage having a transistor gate coupled to said transmission line, said output stage for generating said output signal in response to the potential at an end portion of said transmission line with an operating power source formed by a first power source supplying a first potential and a second power source supplying a second potential being lower than said first potential.

2. The semiconductor memory device in accordance with claim 1, wherein:

said transmission line includes:
a first data bus, and
a second data bus being different from said first data bus, said drive circuit includes:
a first adjusting circuit deciding the potential at said first data bus in response to said internal signal, and
a second adjusting circuit deciding the potential at said second data bus in response to said internal signal, and said output signal generation circuit includes:
a first P-channel insulated gate field-effect transistor being supplied with a current from said first power source in response to the potential at an end portion of said first data bus for generating said output signal corresponding to said first potential and transmitting the same to said output terminal, and
a first N-channel insulated gate field-effect transistor being supplied with a current from said second power source in response to the potential at an end portion of said second data bus for generating said output signal corresponding to said second potential and transmitting the same to said output terminal.

3. The semiconductor memory device in accordance with claim 2, further comprising:

a second P-channel insulated gate field-effect transistor being supplied with a current from said first power source in response to a first control signal specifying said read operation mode for transmitting a signal corresponding to said first potential to said first data bus, and a second N-channel insulated gate field-effect transistor being supplied with a current from said second power source in response to a second control signal being obtained by inverting said first control signal for transmitting a signal corresponding to said second potential to said second data bus, said first control signal is in an activated state in said read operation mode and in an inactivated state in an operation mode other than said read operation mode, said second P-channel insulated gate field-effect transistor enters a non-conducting state if said first control signal is in an activated state, and enters a conducting state if said first control signal is in an inactivated state, and said second N-channel insulated gate field-effect transistor enters a non-conducting state if said second control signal is in an activated state, and enters a conducting state if said second control signal is in an inactivated state.

4. The semiconductor memory device in accordance with claim 1, wherein said output signal generation circuit includes
a fifth N-channel insulated gate field-effect transistor being supplied with a current from said second power source in response to a first control signal specifying said read operation mode for generating a signal corresponding to said second potential,
a fifth P-channel insulated gate field-effect transistor being supplied with a current from said first power source in response to a second control signal being obtained by inverting said first control signal for generating a signal corresponding to said first potential,
a sixth P-channel insulated gate field-effect transistor transmitting said signal being generated from said fifth P-channel insulated gate field-effect transistor to said output terminal in response to the potential at said end portion of said transmission line, and
a sixth N-channel insulated gate field-effect transistor transmitting said signal being generated from said fifth N-channel insulated gate field-effect transistor to said output terminal in response to the potential at said end portion of said transmission line,
said first control signal is in an activated state in said read operation mode and in an inactivated state in an operation mode other than said read operation mode,
said fifth P-channel insulated gate field-effect transistor enters a conducting state if said second control signal is in an activated state, and enters a non-conducting state if said second control signal is in an inactivated state, and
said fifth N-channel insulated gate field-effect transistor enters a conducting state if said first control signal is in an activated state, and enters a non-conducting state if said first control signal is in an inactivated state.

5. The semiconductor memory device in accordance with claim 4, wherein
a value obtained by adding up threshold voltages of said sixth P-channel insulated gate field-effect transistor and said sixth N-channel insulated gate field-effect transistor is higher than said first potential.

6. The semiconductor memory device in accordance with claim 1, further comprising a sense amplifier coupled to the drive circuit for generating the internal signal.

7. The semiconductor memory device in accordance with claim 1, wherein
said output signal generation circuit includes
a seventh N-channel insulated gate field-effect transistor being supplied with a current from said second power source in response to the potential at said end portion of said transmission line for generating a signal corresponding to said second potential,
a seventh P-channel insulated gate field-effect transistor being supplied with a current from said first power source in response to the potential at said end portion of said transmission line for generating a signal corresponding to said first potential,
an eighth N-channel insulated gate field-effect transistor transmitting said signal being generated from said seventh N-channel insulated gate field-effect transistor to said output terminal in response to a first control signal specifying said read operation mode, and an eighth P-channel insulated gate field-effect transistor transmitting said signal being generated from said seventh P-channel insulated gate field-effect transistor to said output terminal in response to a second control signal being obtained by inverting said first control signal, said first control signal is in an activated state in said read operation mode, and in an inactivated mode in an operation mode other than said read operation mode, said eighth P-channel insulated gate field-effect transistor enters a conducting state if said second control signal is in an activated state, and enters a non-conducting state if said second control signal is in an inactivated state, and said eighth N-channel insulated gate field-effect transistor enters a conducting state if said first control signal is in an activated state, and enters a non-conducting state if said first control signal is in an inactivated state.

8. The semiconductor memory device in accordance with claim 7, wherein a value obtained by adding up threshold voltages of said seventh P-channel insulated gate field-effect transistor and said seventh N-channel insulated gate field-effect transistor is higher than said first potential.

9. The semiconductor memory device in accordance with claim 1, wherein said output signal generation means includes a ninth P-channel insulated gate field-effect transistor being supplied with a current from said first power source in response to the potential at said end portion of said transmission line for transmitting a signal corresponding to said first potential to said output terminal, and a ninth N-channel insulated gate field-effect transistor being supplied with a current from said second power source in response to the potential at said end portion of said transmission line for transmitting a signal corresponding to said second potential to said output terminal.

10. The semiconductor memory device in accordance with claim 9, further comprising multiplexer means transmitting a signal being outputted from said output signal generation means to said output terminal in response to a first control signal specifying said read operation mode and a second control signal being obtained by inverting said first control signal.

11. The semiconductor memory device in accordance with claim 9, wherein a value obtained by adding up threshold voltages of said ninth P-channel insulated gate field-effect transistor and said ninth N-channel insulated gate field-effect transistor is higher than said first potential.

12. A semiconductor memory device applying an output signal to an external load at an output terminal in response to an internal signal being read from a selected memory cell in a read operation mode, said semiconductor memory device comprising:

a first data bus;

a first adjusting circuit deciding the potential at said first data bus in response to said internal signal;

a first switching circuit coupled to said first data bus; and a second data bus different from said first data bus;

a second adjusting circuit deciding the potential at said second data bus in response to said internal signal;

a second switching circuit coupled to said second data bus; and an output signal generation circuit, including an output stage having first and second transistor gates coupled respectively to said first switching circuit and said second switching circuit, said output stage for generating said output signal with an operating power source formed by a first power source supplying a first potential and a second power source supplying a second potential being lower than said first potential;

wherein:

said first switching circuit cuts off transmission of a signal from said first adjusting circuit to said output signal generation circuit in an operation mode other than said read operation mode, and said second switching circuit cuts off transmission of a signal from said second adjusting circuit to said output signal generation circuit in said operation mode other than said read operation mode.

13. The semiconductor memory device in accordance with claim 12, wherein said output signal generation circuit includes:

a first P-channel insulated gate field-effect transistor being supplied with a current from said first power source in response to the potential at an end portion of first switching circuit for generating said output signal corresponding to said first potential and transmitting the same to said output terminal, and a first N-channel insulated gate field-effect transistor being supplied with a current from said second power source in response to the potential at an end portion of said switching circuit for generating said output signal corresponding to said second potential and transmitting the same to said output terminal.

14. The semiconductor memory device in accordance with claim 13, further comprising:

a second P-channel insulated gate field-effect transistor being supplied with a current from said first power source in response to a first control signal specifying said read operation mode for transmitting a signal corresponding to said first potential to said first data bus, and a second N-channel insulated gate field-effect transistor being supplied with a current from said second power source in response to a second control signal being obtained by inverting said first control signal for transmitting a signal corresponding to said second potential to said second data bus, said first control signal is in an activated state in said read operation mode and in an inactivated state in an operation mode other than said read operation mode, said second P-channel insulated gate field-effect transistor enters a non-conducting state if said first control signal is in an activated state, and enters a conducting state if said first control signal is in an inactivated state, and said second N-channel insulated gate field-effect transistor enters a non-conducting state if said second control signal is in an activated state, and enters a conducting state if said second control signal is in an inactivated state.

15. The semiconductor memory device in accordance with claim 14, wherein:

said first switching circuit includes
- a third N-channel insulated gate field-effect transistor receiving said first control signal at its gate, and
- a third P-channel insulated gate field-effect transistor receiving said second control signal at its gate, and said second switching circuit includes
- a fourth N-channel insulated gate field-effect transistor receiving said first control signal at its gate, and
- a fourth P-channel insulated gate field-effect transistor receiving said second control signal at its gate.

16. The semiconductor memory device in accordance with claim 12, further comprising a sense amplifier coupled to the drive circuit for generating the internal signal.

* * * * *